(12) United States Patent
Lee et al.

(10) Patent No.: US 9,406,543 B2
(45) Date of Patent: Aug. 2, 2016

(54) SEMICONDUCTOR POWER DEVICES AND METHODS OF MANUFACTURING THE SAME

(71) Applicant: Samsung Electronics Co., Ltd., Suwon-si (KR)

(72) Inventors: Jae-Hoon Lee, Suwon-si (KR); Tae-Geun Kim, Bucheon-si (KR); Chan-Ho Park, Seongnam-si (KR); Hyun-Jung Her, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/504,847

(22) Filed: Oct. 2, 2014

(65) Prior Publication Data

US 2015/0162423 A1  Jun. 11, 2015

(30) Foreign Application Priority Data

Dec. 10, 2013 (KR) .................. 10-2013-0152968
Mar. 6, 2014 (KR) .................. 10-2014-0026567

(51) Int. Cl.

| | | |
|---|---|---|
| H01L 29/739 | (2006.01) | |
| H01L 21/761 | (2006.01) | |
| H01L 21/265 | (2006.01) | |
| H01L 29/40 | (2006.01) | |
| H01L 29/66 | (2006.01) | |

(Continued)

(52) U.S. Cl.
CPC ............ *H01L 21/761* (2013.01); *H01L 21/265* (2013.01); *H01L 29/0619* (2013.01); *H01L 29/0834* (2013.01); *H01L 29/402* (2013.01); *H01L 29/66348* (2013.01); *H01L 29/7397* (2013.01)

(58) Field of Classification Search
CPC ................................................ H01L 29/7811
See application file for complete search history.

(56) References Cited

U.S. PATENT DOCUMENTS 5,032,878 A   7/1991  Davies et al.
5,777,373 A   7/1998  Groenig (Continued)

FOREIGN PATENT DOCUMENTS

JP   2006-319218 A   11/2006
KR   10-2010-0084503 A   7/2010

(Continued)

*Primary Examiner* — Eugene Lee
(74) *Attorney, Agent, or Firm* — Muir Patent Law, PLLC

(57) ABSTRACT

A semiconductor power device includes a substrate, a plurality of gate electrode structures, a floating well region and a termination ring region. The substrate has a first region and a second region. A plurality of gate electrode structures is formed on the substrate, each of the gate electrode structures extends from the first region to the second region and includes a first gate electrode, a second gate electrode and a connecting portion, the first and second gate electrodes extend in a first direction, and the connecting portion connects end portions of the first and second gate electrodes to each other. The floating well region is doped with impurities between the gate electrode structures in the first region of the substrate, and the floating well region has a first impurity concentration and a first depth. The termination ring region is doped with impurities in the second region of the substrate, is spaced apart from the gate electrode structures, and has a ring shape surrounding the first region, and has the first impurity concentration and the first depth. The semiconductor power device may have a high breakdown voltage.

17 Claims, 19 Drawing Sheets

(51) Int. Cl.
*H01L 29/06* (2006.01)
*H01L 29/08* (2006.01)

(56) References Cited

U.S. PATENT DOCUMENTS

| | | | |
|---|---|---|---|
| 6,838,735 B1 * | 1/2005 | Kinzer et al. | 257/365 |
| 6,870,201 B1 | 3/2005 | Deboy et al. | |
| 7,304,356 B2 | 12/2007 | Takahashi | |
| 7,772,642 B2 | 8/2010 | Marchant | |
| 7,923,804 B2 | 4/2011 | Zeng et al. | |
| 8,384,151 B2 | 2/2013 | Pfirsch | |
| 8,466,514 B2 * | 6/2013 | Hsieh | 257/330 |
| 2004/0262678 A1 * | 12/2004 | Nakazawa et al. | 257/330 |
| 2009/0090967 A1 | 4/2009 | Chen et al. | |
| 2013/0069109 A1 * | 3/2013 | Matsuda et al. | 257/139 |
| 2013/0248979 A1 * | 9/2013 | Ono et al. | 257/329 |

FOREIGN PATENT DOCUMENTS

| | | |
|---|---|---|
| KR | 10-0990419 B | 10/2010 |
| KR | 10-2011-0015788 A | 2/2011 |
| KR | 10-2013-0005131 A | 1/2013 |
| KR | 2013-0040516 A | 4/2013 |

* cited by examiner

SEMICONDUCTOR POWER DEVICES AND METHODS OF MANUFACTURING THE SAME

CROSS-REFERENCE TO RELATED APPLICATION

This application claims priority under 35 USC §119 to Korean Patent Application No. 10-2013-0152968, filed on Dec. 10, 2013 and No. 10-2014-0026567, filed on Mar. 6, 2014 in the Korean Intellectual Property Office (KIPO), the contents of which are herein incorporated by reference in their entirety.

BACKGROUND

1. Field

Example embodiments relate to semiconductor power devices and methods of manufacturing the same. More particularly, example embodiments relate to insulated gate bipolar transistors (IGBTs) and methods of manufacturing the same.

2. Description of the Related Art

A semiconductor power device typically should have a high operating voltage and a high breakdown voltage. Also, the semiconductor power device generally should have a high current density, which may be achieved by integrating as many cells as possible in a unit area. A simple method for manufacturing such a semiconductor power device is desirable.

SUMMARY

Example embodiments provide a semiconductor power device that may be manufactured by simple processes.

Example embodiments provide a method of manufacturing a semiconductor power device by simple processes.

According to example embodiments, there is provided a semiconductor power device. The semiconductor power device includes a substrate, a plurality of gate electrode structures, a floating well region and a termination ring region. The substrate has a first region and a second region. A plurality of gate electrode structures is formed on the substrate, each of the gate electrode structures extends from the first region to the second region and includes a first gate electrode, a second gate electrode and a connecting portion, the first and second gate electrodes extend in a first direction, and the connecting portion connects end portions of the first and second gate electrodes to each other. The floating well region is doped with impurities between the gate electrode structures in the first region of the substrate, and the floating well region has a first impurity concentration and a first depth. The termination ring region is doped with impurities in the second region of the substrate, spaced apart from the gate electrode structures, has a ring shape surrounding the first region, and has the first impurity concentration and the first depth.

In example embodiments, the termination ring region may include (m+1) numbers of the termination ring regions (m is a natural number), the termination ring regions may be disposed to have a concentric circular ring shape, and an n-th distance between an n-th termination ring region and an (n+1)-th termination ring region (n is a natural number less than m+1) may increase according to the increase of a value of n.

In example embodiments, a first distance between the first termination ring region and the second termination ring region may be about 14 μm to about 20 μm, and the n-th distance may increase according to the increase of a value of n by a given value in a range of about 1 μm to about 6 μm.

In example embodiments, the termination ring region includes a plurality of concentric ring sub-regions, wherein as a distance from the first region of the substrate increases, a distance between adjacent ones of the concentric ring sub-regions increases.

In example embodiments, the n-th distance may be in a range of about (2n+12) μm to about (2n+18) μm (n is less than m).

In example embodiments, the n-th distance may be in a range of about (2n+15) μm to about (2n+25) μm (n is m).

In example embodiments, the semiconductor power device may further include a junction termination extension (JTE) region in the second region of the substrate, the JTE region may have a ring shape surrounding the first region and contacting the connecting portion of each of the gate electrode structures, and the JTE region may be doped with impurities having the first impurity concentration and the first depth.

In example embodiments, the termination ring region includes a plurality of termination ring sub-regions including at least a first termination ring sub-region having sidewalls spaced a particular width apart, and a width between one sidewall of the JTE region and an adjacent sidewall of the connecting portion is about 0.5 times to about 2 times of the width between the sidewalls of the first termination ring sub-region.

In example embodiments, the semiconductor power device may further include an insulating interlayer, a contact plug and a metal layer pattern. The insulating interlayer may have a flat top surface on the substrate and the gate electrode structures. The contact plug may be through the insulating interlayer, and the contact plug may contact the connecting portion. The metal layer pattern may be on the contact plug and the insulating interlayer, and the metal layer pattern may surround the first region and may be electrically connected to the gate electrode structures.

In example embodiments, the metal layer pattern may be adjacent to the termination ring region, and a width of the metal layer pattern may be about 30 μm to about 60 μm.

In example embodiments, gate electrode structures may be buried in the substrate.

According to example embodiments, a semiconductor device may include: a substrate having a first, inner, region and a second, outer, region horizontally adjacent the first region; a plurality of gate electrode structures on the substrate, each of the gate electrode structures extending from the first region to the second region and including a first gate electrode, a second gate electrode and a connecting portion, the first and second gate electrodes extending in a first direction, and the connecting portion connecting end portions of the first and second gate electrodes to each other, wherein each of the first electrode, the second electrode, and the connecting portion are at the same vertical level; a floating well region disposed between the gate electrode structures in the first region of the substrate, the floating well region doped with first impurities of a first type and having a first impurity concentration and a first depth; and a termination ring region doped with impurities in the second region of the substrate, the termination ring region being spaced apart from the gate electrode structures, having a ring shape surrounding the first region, and having the first impurity concentration of the first type and having the first depth. The termination ring region may include a plurality of concentric termination ring sub-regions, at least one termination ring sub-region spaced closer to an inner adjacent termination ring sub-region than to an outer adjacent termination ring sub-region.

In certain embodiments, the substrate is doped with impurities of a second type opposite the first type.

In certain embodiments, each termination ring sub-region is formed from a top surface of the substrate into the substrate to the first depth, and the semiconductor device further includes a first metal layer pattern formed above each first gate electrode and each second gate electrode, a second metal layer pattern formed above each connecting portion and electrically connected to the corresponding connecting portion, and a third metal layer pattern formed above the termination ring region and electrically connected to at least one termination ring sub-region.

In certain embodiments, the semiconductor device further includes: a first contact plug electrically connecting the first metal layer pattern to a first transistor that includes a first gate structure of the plurality of gate structures; a second contact plug electrically connecting the second metal layer pattern to one of the connecting portions; and a third contact plug electrically connecting the third metal layer pattern to the termination ring region.

A junction termination region may be formed outside of the connecting portion and doped with the same impurities and impurity concentration as the termination ring region.

Further, each termination ring sub-region may have sidewalls spaced a first distance apart from each other, the connecting portion may have a first sidewall, and the junction termination region may have a second sidewall, wherein the first sidewall is spaced a second distance apart from the second sidewall. The second distance may be, for example, about 0.5 to about 2 times the length of the first distance.

In certain embodiments, the termination ring sub-regions are spaced apart from each other in a gradually increasing manner, and a concentration of an electric field at edge portions of the semiconductor device are decreased based on the distances between the termination ring sub-regions.

According to example embodiments, there is provided a method of manufacturing a semiconductor device. In the method, a plurality of gate electrode structures is formed on a substrate having first and second regions, and each of the gate electrode structures includes a first gate electrode, a second gate electrode and a connecting portion. Impurities are doped into a portion of the substrate in the first region between the gate electrode structures and a portion of the substrate in the second region spaced apart from the gate electrode structures to form a floating well regions having a first impurity concentration and a first depth in the first region and to form a termination ring region having the first impurity concentration and the first depth in the second region.

In example embodiments, when the impurities are doped into the portion of the substrate in the first region between the gate electrode structures and the portion of the substrate in the second region, the impurities are doped into a portion of the substrate in the second region surrounding the first region to form a JTE region contacting the connecting portion of each of the gate electrode structures, and the JTE region may have the first impurity concentration and the first depth.

In example embodiments, when the floating well regions, the termination ring region and the JTE region are formed, an ion implantation mask exposing portions of the substrate corresponding to the floating well region, the termination ring region and the JTE region may be formed, and impurities may be implanted into the exposed portions of the substrate using the ion implantation mask.

In example embodiments, when a plurality of termination ring sub-regions are formed to have a concentric circular ring shape, distances between the termination ring sub-regions may be formed to increase as distances of the termination ring sub-regions from the first region increase.

In example embodiments, the method may further include forming an insulating interlayer, a contact plug and a metal layer pattern. The insulating interlayer may be formed to have a flat top surface on the substrate and the gate electrode structures, the contact plug may be formed through the insulating interlayer to contact the connecting portion of each of the gate electrode structures, and a metal layer pattern may be formed on the contact plug and the insulating interlayer to be electrically connected to the gate electrode structures. The metal layer pattern may surround the first region.

As described above, a semiconductor power device may be manufactured by simple processes, and may have good electric characteristics.

BRIEF DESCRIPTION OF THE DRAWINGS

Example embodiments will be more clearly understood from the following detailed description taken in conjunction with the accompanying drawings.

FIG. 1 is a plan view illustrating a semiconductor power device in accordance with example embodiments;

FIG. 2 is a plan view illustrating an edge portion of the semiconductor power device in accordance with example embodiments;

FIG. 3 is a cross-sectional view illustrating the semiconductor power device in accordance with example embodiments;

FIGS. 4 to 11 are cross-sectional views illustrating stages of a method of manufacturing the semiconductor power device of FIG. 1, in accordance with example embodiments;

FIG. 12 is a cross-sectional view illustrating a semiconductor power device in accordance with other example embodiments;

FIG. 13 is a cross-sectional view illustrating a method of manufacturing the semiconductor device of FIG. 12, in accordance with example embodiments;

FIG. 14 is a cross-sectional view illustrating a semiconductor power device in accordance with other example embodiments; and FIGS. 15 to 19 are cross-sectional views illustrating stages of a method of manufacturing the semiconductor power device of FIG. 14, in accordance with example embodiments.

DETAILED DESCRIPTION

Figure 1:
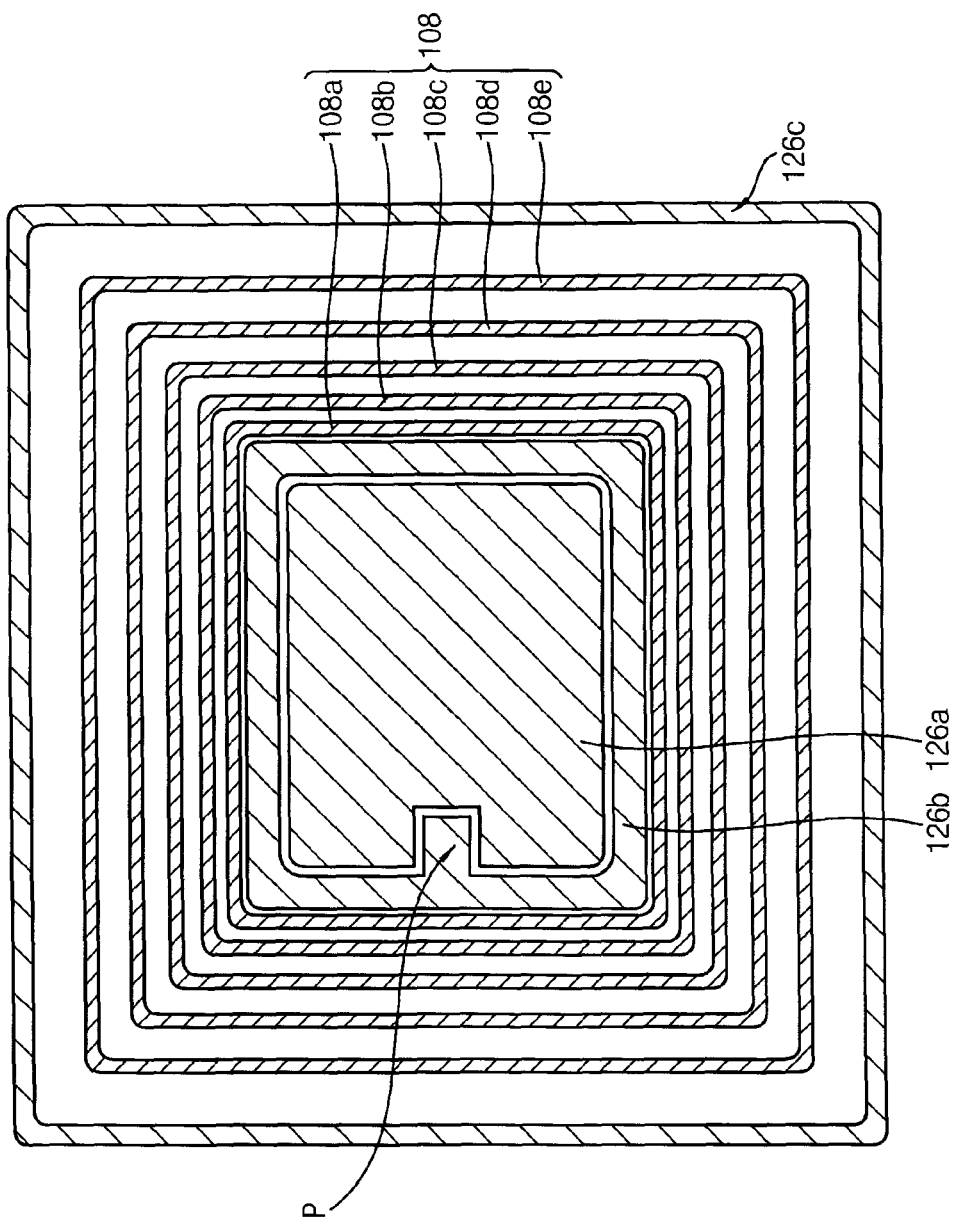
FIGS. 1 to 19 represent non-limiting example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, or as "contacting" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section, for example as a naming convention. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present inventive concept.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
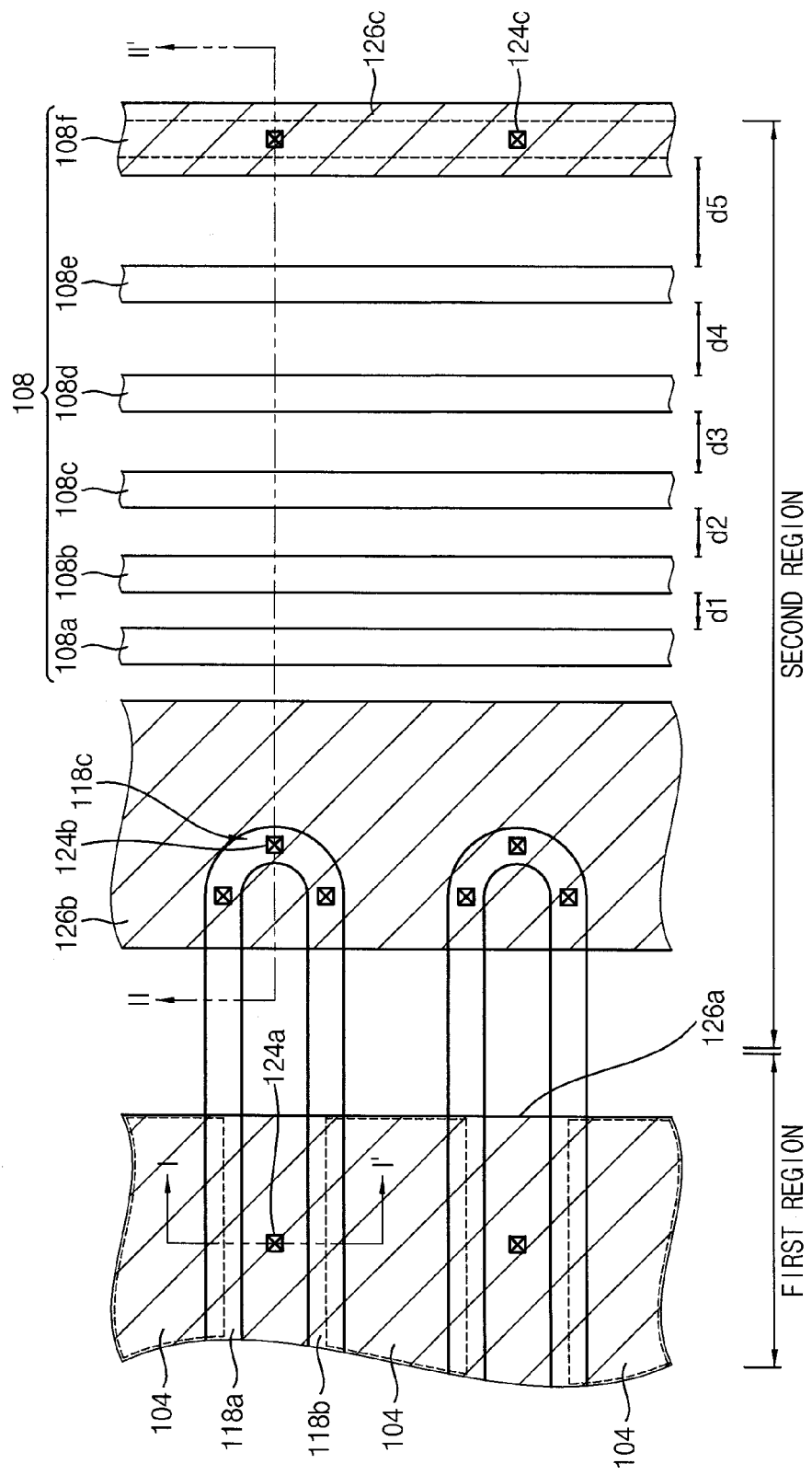
Figure 3:
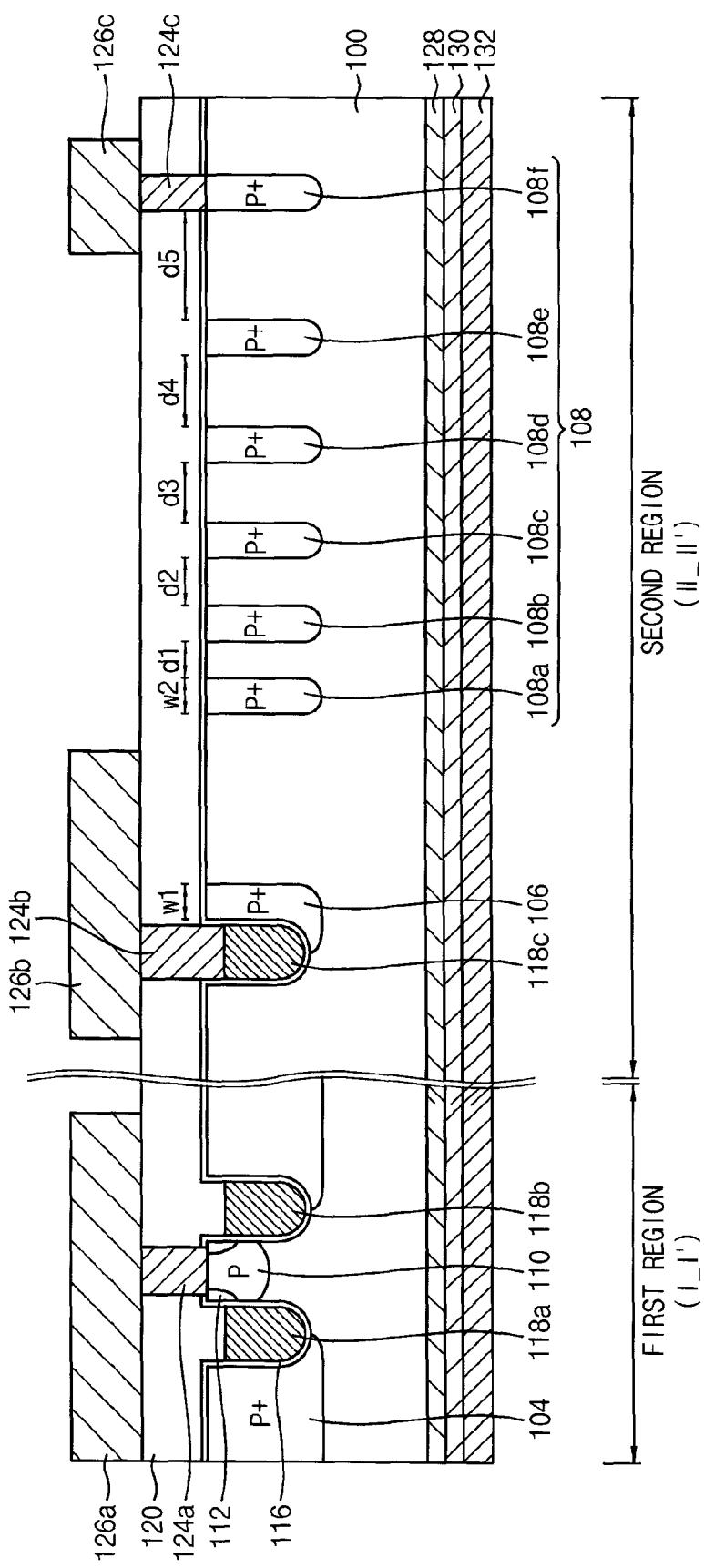

FIG. 1 is a plan view illustrating a semiconductor power device in accordance with example embodiments. FIG. 2 is a plan view illustrating an edge portion of the semiconductor power device in accordance with example embodiments. FIG. 3 is a cross-sectional view illustrating the semiconductor power device in accordance with example embodiments.

FIG. 3 shows a cross-sectional view cut along a line I-I' in a first region and a cross-sectional view cut along a line II-II' in a second region. The semiconductor power device may be an insulated gate bipolar transistor (IGBT), but is not limited thereto. The semiconductor power device may include various high voltage devices having a termination ring region at an edge portion thereof.

Referring to FIGS. 1 to 3, the semiconductor power device may include a substrate 100, a gate electrode structure, a floating well region 104, and a termination ring region 108. The substrate 100 may be divided into the first region and the second region. For example, the first region may serve as an active region for forming cells of the semiconductor power device. The second region may serve as a termination region that may be located at an outside of the active region.

The substrate 100 may include a first surface, which may be an upper surface for forming a transistor, and a second surface, which may be a lower surface opposite to the first surface. The substrate 100 may be, e.g., a silicon substrate.

According to one embodiment, the substrate 100 may be lightly doped with n-type impurities. For example, a doping concentration of the n-type impurities in the substrate 100 may be about $10^{13}/cm^3$ to about $10^{16}/cm^3$. In consideration of the doping concentration of the n-type impurities, the substrate 100 may be referred to as an n-minus (n−) substrate. However, the material and the doping concentration of the substrate 100 not limited thereto, and may be changed.

Hereinafter, devices formed on the first surface of the substrate 100 are illustrated.

A transistor for forming the cells may be provided in the first region of the substrate 100. An end portion of the gate electrode structure of the transistor may be located in the second region of the substrate 100.

In example embodiments, the transistor may be a trench gate type transistor. For example, a gate trench (not shown) for forming a gate structure may be formed at an upper portion of the substrate 100. The transistor may have a channel adjacent to a sidewall of the gate trench from a bottom of the gate trench to the first surface of the substrate 100, and thus may be a vertical channel transistor. The trench gate type transistor may have more numbers of cells per unit area than those of a planar type transistor. The gate structure of the trench gate type transistor may include a gate insulating layer 116 and the gate electrode structure.

The gate insulating layer 116 may be conformally formed on an inner surface of the gate trench. The gate insulating layer 116 may include, for example, silicon oxide.

The gate electrode structure may include a pair of neighboring gate electrodes 118a and 118b and a connecting portion 118c for connecting the neighboring gate electrodes 118a and 118b to each other. Thus, the gate electrode structure may include a first gate electrode 118a, a second gate electrode 118b adjacent to the first gate electrode 118a, and the connecting portion 118c for connecting the first and second electrodes 118a and 118b to each other.

In example embodiments, a plurality of gate electrode structures may be formed in a direction, and accordingly a plurality of transistors may be formed. Hereinafter, a trench for forming the first gate electrode 118a may be referred to as a first trench, and a trench for forming the second gate electrode 118b may be referred to as a second trench. A trench for forming the connecting portion 118c may be referred to as a third trench. Each of the first and second gate electrodes 118a and 118b may extend from the first region to the second region, and end portions of the first and second gate electrodes 118a and 118b may be connected with each other by the connecting portion 118c in the second region.

In a plan view, an end portion of the gate electrode structure may have a rounded shape. For example, in a plan view, the gate electrode structure may have a ring shape, and thus an electric field may not be concentrated on the connecting portion 118c. The gate electrode structure may include, e.g., polysilicon and/or a metal.

Upper surfaces of the first and second gate electrodes 118a and 118b may be lower than top portions of the first and second trenches, respectively. Thus, in one embodiment, the first and second gate electrodes 118a and 118b are not connected with each other on the first surface of the substrate 100.

In certain exemplary embodiments, as the first and second gate electrodes 118a and 118b may be formed only within the first and second trenches and do not protrude from the top portions of the first and second trenches, respectively, surface damages of the first and second gate electrodes 118a and 118b caused by a polishing process may be decreased. Thus, a gate leakage current and charge trapping of the transistor including the first and second gate electrodes 118a and 118b may be decreased.

The first and second gate electrodes 118a and 118b in the gate electrode structure may be spaced apart from each other by a first gap having a first length. Hereafter, an upper portion of the substrate 100 between the first and second gate electrodes 118a and 118b in the gate electrode structure may be referred to as a first portion.

The plurality of gate electrode structures may be spaced apart from each other by a second gap having a second length. The second gap or second length may be longer than the first gap or first length. Hereafter, an upper portion of the substrate 100 between the plurality of gate electrode structures may be referred to as a second portion.

In the first portion, first impurity regions 112 may be provided at upper portions of the substrate 100 adjacent to the first and second gate electrodes 118a and 118b, respectively. The first impurity regions 112 may be highly doped with n-type impurities. For example, a doping concentration of the n-type impurities of the first impurity regions 112 may be about $10^{15}/cm^3$ to about $10^{21}/cm^3$.

In the first portion, a second impurity region 110 may be provided to surround the first impurity regions 112. For example, the first impurity regions 112 may be provided within the second impurity region 110. A depth of the second impurity region 110 may be deeper than depths of the first impurity regions 112. Thus the second impurity region 110 may cover the first impurity regions 112. Also, a bottom surface of the second impurity region 110 may be higher than bottom surfaces of the first and second gate trenches.

The second impurity region 110 may be doped with impurities having a first conductivity type different from that of the first impurity region 112. For example, the second impurity region 110 may be doped with p-type impurities. A doping concentration of the p-type impurities in the second impurity region 110 may be about $10^{15}/cm^3$ to about $10^{21}/cm^3$. In consideration of the doping concentration of the p-type impurities, the second impurity region 110 may be referred to as a p-zero (p0) region or a p-plus (p+) region.

A switching operation of the transistor may be suppressed in the second portion. For example, the transistor including the first and second gate electrodes 118a and 118b may not perform a switching operation in the second portion, and the plurality of transistors may be electrically isolated or insulated from each other. Therefore, the second gap may be longer than the first gap so as to suppress the switching operation of the transistors and to prevent a disturbance between the transistors.

The floating well region 104 may be provided in the second portion. The floating well region 104 may be doped with impurities having a conductivity type different from that of the impurities of the base substrate 100. The floating well region 104 may have a concentration of impurities higher than that of the second impurity region 110. Therefore, the floating well region 104 may be highly doped with p-type impurities. As the floating well region 104 may be provided in the second portion, the transistor including the first and second gate electrodes 118a and 118b may not perform a switching operation in the second portion.

The floating well region 104 may have a first impurity concentration and a first depth. The first depth may be deeper than a depth of the second impurity region 110. Also, the first depth may be deeper than depths of the gate trenches.

A junction termination extension (JTE) region 106 may be provided in the substrate 100 adjacent to the connecting portion 118c between the first and second electrodes 118a and 118b. In example embodiments, a plurality of termination ring regions 108 may be provided in the substrate 100 to be spaced apart from the JTE region 106. Each of the plurality of termination ring regions 108 may be referred to as a termination ring sub-region, or a termination ring.

The JTE region 106 may be doped with impurities having a conductivity type different from that of the floating well region 104. The JTE region 106 may be highly doped with p-type impurities. The JTE region 106 may have the first impurity concentration and the first depth. In a plan view, the JTE region 106 may have a ring shape surrounding the first region.

The JTE region 106 may be formed adjacent to a sidewall of the connecting portion 118c. The JTE region 106 may have a first width W1 in a horizontal direction from an upper sidewall of the connecting portion 118c.

In a plan view, the termination ring region 108 may have a ring shape surrounding the first region serving as the active region. Also, the plurality of termination ring regions 108 may be disposed to have a concentric circular ring shape. The plurality of termination ring regions 108 may include, e.g., first, second, third, fourth, fifth and sixth termination ring regions 108a, 108b, 108c, 108d, 108e and 108f, respectively, according to distances thereof from the first region in this order. Thus, the first termination ring region 108a, also referred to as a first termination ring or first termination ring sub-region, may be the closest one of the termination ring regions 108 to the first region, and the sixth termination ring region 108f, also referred to as the sixth termination ring or sixth termination ring sub-region, may be the farthest one of the termination ring regions 108 to the first region. However, the number of the termination ring regions 108 may not be limited thereto. In one embodiment, the termination ring regions 108 may be doped with impurities having a conductivity type the same as that of the floating well region 104. The termination ring regions 108 may be highly doped with p-type impurities. Also, the termination ring regions 108 may have the first impurity concentration and the first depth. As described above and as shown in FIG. 3, the floating well region 104 in the first region, and the JTE region 106 and the termination ring regions 108 in the second region may have substantially the same impurity concentration and substantially the same depth.

Each of the termination ring regions 108a-108f may have a second width W2 at the first surface of the substrate 100. In one embodiment, the first width W1 of the JTE region 106 (e.g., a width between a sidewall of the JTE 106 region and an adjacent sidewall of the corresponding connecting portion 118c, or a width at the first surface of the substrate of the JTE region 106) may be less than that of a conventional semiconductor power device. For example, the first width W1 may be in a range of about 10 μm to about 20 μm, and the first width W1 may be about 0.5 times to about 2 times of the second width W2. According to the small first width W1, an integration degree of the semiconductor power device may be increased.

The termination ring regions 108 may be disposed so that an electric field may not be concentrated at an edge portion of the semiconductor power device. In example embodiments, distances between the termination ring regions 108 may increase as the distances of the termination ring regions 108 from the first region increase.

For example, a first distance D1 between the first termination ring region 108a and the second termination ring region 108b may be, e.g., in a range of about 14 μm to about 20 μm. Second, third, fourth and fifth distances D2, D3, D4 and D5 may be distances between the second termination ring region 108b and the third termination ring region 108c, between the third termination ring region 108c and the fourth termination ring region 108d, between the fourth termination ring region 108d and the fifth termination ring region 108e, and between the fifth termination ring region 108e and the sixth termination ring region 108f, respectively. In one embodiment, the second, third, fourth and fifth distances D2, D3, D4, D5 may increase in this order by a constant value, e.g., by a given value in a range of about 1 μm to about 6 μm. Particularly, the fifth distance D5, which may be a distance between the farthest one and the next one of the termination ring regions 108 from the first region, may be increased more than the fourth distance, e.g., by a given value in a range of about 2 μm to about 20 μm. As such, the termination ring region 108 may include at least one termination ring sub-region spaced closer to an inner adjacent termination ring sub-region than to an outer adjacent termination ring sub-region.

In certain embodiments, if there are (m+1) termination ring sub-regions 108 (m is a natural number), an n-th distance between an n-th termination ring sub-region and an (n+1)-th termination ring sub-region (n is a natural number less than m) may be in a range of about (2n+12) μm to about (2n+18) μm, and an m-th distance between an (m−1)-th termination ring sub-region and an m-th termination ring sub-region may be in a range of about (2m+15) μm to about (2m+25) μm. Accordingly, the termination ring sub-regions may be spaced apart from each other in a gradually increasing manner.

As the number of the termination ring sub-regions 108 increases, an integration degree of the semiconductor power device may be decreased. Therefore, in certain embodiments, the number of the termination ring sub-regions 108 may be about 5 to about 10 in consideration of the integration degree and the breakdown voltage characteristics of the semiconductor power device.

The concentration of an electric field at the edge portion of the semiconductor power device may be decreased by controlling the distances between the termination ring regions 108 as described above. Thus, the semiconductor power device may have a high breakdown voltage, e.g., over about 1200 V.

An insulating interlayer 120 may be provided on the first and second regions of the substrate 100. The insulating interlayer 120 may have a flat top surface. The insulating interlayer 120 may include, e.g., silicon oxide. The insulating interlayer 120 may be formed, for example, by a chemical vapor deposition (CVD) process.

A first contact plug 124a may be provided through the insulating interlayer 120 in the first region to contact the first surface in the first portion of the substrate 100. A second contact plug 124b may be provided through the insulating interlayer 120 in the second region to contact the connecting portion 118c between the first and second gate electrodes 118a and 118b. In example embodiments, a plurality of first contact plugs 124a and a plurality of second contact plugs 124b may be formed. Also, at least one third contact plug 124c may be provided through the insulating interlayer 120 in the second region to contact at least one of the termination ring regions 108. In example embodiments, a plurality of third contact plugs 124c may be provided to contact the plurality of termination ring regions 108, respectively.

The first to third contact plugs 124a, 124b and 124c may be formed of a conductive material, such as a metal, for example. In certain embodiments, the first to third contact plugs 124a, 124b and 124c may include substantially the same metal. For example, the first to third contact plugs 124a, 124b and 124c may include W, Au, Ag, Cu, Al, TiAlN, WN, Ir, Pt, Pd, Ru, Zr, Rh, Ni, Co, Cr, Sn, Zn, etc.

In example embodiments, the first to third contact plugs 124a, 124b and 124c may include a metal having a suitable strength to endure a chemical mechanical polishing (CMP) process. For example, each of the first to third contact plugs 124a, 124b and 124c may include a barrier metal layer (not shown) and a metal layer (not shown). The insulating interlayer 120 and the first to third contact plugs 124a, 124b and 124c may have flat top surfaces.

A first metal layer pattern 126a having a flat top surface may be provided on the insulating interlayer 120 in the first region. The first metal layer pattern 126a may contact the first contact plug 124a.

The first metal layer pattern 126a may cover most of the first region. The first metal layer pattern 126a may serve as a layer for wire bonding. Also, the first metal layer pattern 126a may include a conductive material (e.g., a metal) and may function as an emitter electrode. As the first metal layer pattern 126a may have a flat top surface, the wire bonding may be easily performed, and a generation of cracks in the first metal layer pattern 126a may be decreased.

A second metal layer pattern 126b may be provided on the insulating interlayer 120 to contact the second contact plug 124b in the second region.

The second metal layer pattern 126b may include a conductive material (e.g., a metal) serve as a field plate pattern for preventing an electric field from being concentrated at the edge portion of the semiconductor power device. The second metal layer pattern 126b may have a wide width so that the electric field may be prevented from being concentrated at the edge portion effectively. In an example embodiment, the second metal layer pattern 126b may extend in the horizontal direction to be adjacent to the first termination ring region 108a. In another example embodiment, the second metal layer pattern 126b may extend in the horizontal direction to overlap at least a portion of the termination ring regions 108. For example, a width of the second metal layer pattern 126b may be about 30 µm to about 60 µm. Due to the second metal layer pattern 126b, the concentration of the electric field may be prevented even with the decreased first width W1 of the JTE region 106.

Also, the second metal layer pattern 126b may serve as a signal bus line that may be connected with the first and second gate electrodes 118a and 118b in the first region. In addition, the second metal layer pattern 126b may contact or may be integrally formed to include a pad electrode P for receiving an external signal. The second metal layer pattern 126b may have a ring shape surrounding the first region. In certain exemplary embodiments, the second metal layer pattern 126b may include a metal having a low resistance. As such, the semiconductor power device may have good electric characteristics.

A third metal layer pattern 126c, formed of a conductive material (e.g., a metal) may be provided to contact the third contact plug 124c on the insulating interlayer 120 in the second region. The third metal layer pattern 126c may be connected with at least one of the termination ring regions 108. In a plan view, the third metal layer pattern 126c may have a ring shape. In an example embodiment, the third metal layer pattern 126c may contact only one of the termination ring regions 108, e.g., the sixth termination ring region 108f. In another example embodiment, a plurality of third metal layer patterns 126c may be formed to have a concentric circular ring shape and contact the plurality of termination ring regions 108 respectively. In certain embodiments, the third metal layer pattern 126c may be dummy patterns that may not perform an actual operation (e.g., do not receive or transmit signals).

Due to the third metal layer pattern 126c, the concentration of the electric field may be decreased.

In one embodiment, the first, second and third metal layer patterns 126a, 126b and 126c may include substantially the same material, such as the same metal. The first, second and third metal layer patterns 126a, 126b and 126c may have flat top surfaces. In one embodiment, the first, second and third metal layer patterns 126a, 126b and 126c include a metal different from that of the first, second and third contact plugs 124a, 124b and 124c. In one embodiment, the first, second and third metal layer patterns 126a, 126b and 126c include a metal having a resistance lower than that of the first, second and third contact plugs 124a, 124b and 124c. The second metal layer pattern 126b may serve as a gate bus line, and thus, because the second metal layer pattern 126b may include a metal having a lower resistance, an operation speed of the semiconductor power device may increase. For example, if the first, second and third contact plugs 124a, 124b and 124c include tungsten, the first, second and third metal layer patterns 126a, 126b and 126c may include aluminum or an aluminum alloy.

A field stop region 128 may be provided at a lower portion of the substrate 100 adjacent to the second surface of the substrate 100. The field stop region 128 may be an n-type impurity region doped with n-type impurities. A concentration of the n-type impurities of the field stop region 128 may be about $10^{14}/cm^3$ to about $10^{18}/cm^3$. In consideration of the concentration of the n-type impurities, the field stop region 128 may be referred to as n-zero (n0) region.

A collector region 130 may be formed beneath the field stop region 128 adjacent to the second surface of the substrate 100. The collector region 130 may be a p-type impurity region doped with p-type impurities.

In an example embodiment, the field stop region 128 and the collector region 130 are not formed in an additional epitaxial layer, but may be formed at lower portions of the substrate 100 adjacent to the second surface, and thus the semiconductor power device may be manufactured at a low cost. In another example embodiment, the field stop region 128 and the collector region 130 may be formed in an additional epitaxial layer on the second surface of the substrate 100.

A second metal layer 132 may be formed on the collector region 130. The second metal layer 132 may serve as a collector electrode. The various metals or metal regions described herein may be more generally referred to as conductive materials and conductive regions.

As the illustrated above, the floating well region 104, the JTE region 106 and the termination ring region 108 may have substantially the same impurity concentration and substantially the same depth, and thus semiconductor power device may be manufactured by simple processes. Also, the distances between the termination ring regions 108 may be optimized, so that the semiconductor power device may have good electrical characteristics.

FIGS. 4 to 11 are cross-sectional views illustrating stages of a method of manufacturing the semiconductor power device of FIGS. 1 to 3 in accordance with example embodiments.

Figure 4:
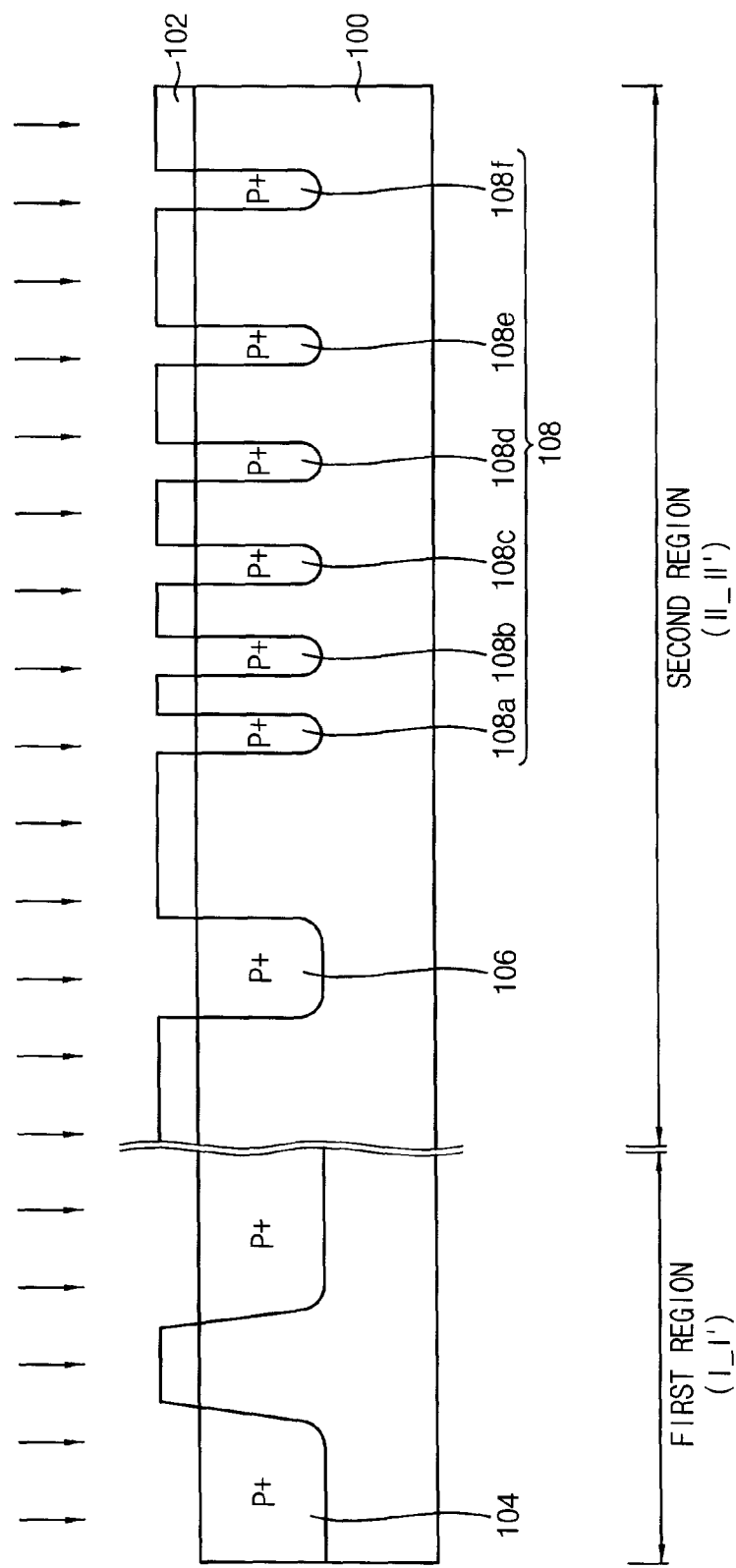

Referring to FIG. 4, a substrate 100 having a first surface and a second surface opposite to the first surface may be provided. On the first surface of the substrate 100, a first region and a second region may be defined. The first region may be an active region, and the second region may be a termination region surrounding the active region. The substrate 100 may be, e.g., a silicon substrate. The substrate 100 may be lightly doped with n-type impurities.

A first ion implantation mask 102 may be formed on the substrate 100. The first ion implantation mask 102 may be, e.g., a photoresist pattern. The first ion implantation mask 102 may be formed by coating a photoresist layer on the substrate 100, and by exposing and developing the photoresist layer. The first ion implantation mask 102 may expose portions of the substrate 100 corresponding to a floating well region 104, a JTE region 106 and a termination ring region 108.

P-type impurities may be doped onto the substrate 100 using the first ion implantation mask 102 to have a first impurity concentration and a first depth. The first impurity concentration may be higher than an impurity concentration of a second impurity region 110 (refer to FIG. 5) that may be subsequently formed.

By the doping process, the floating well region 104 may be formed in the first region, and the JTE region 106 and the termination ring region 108 may be formed in the second region. As the floating well region 104, the JTE region 106 and the termination ring region 108 may be formed by the same doping process, the floating well region 104, the JTE region 106 and the termination ring region 108 may have substantially the same impurity concentration and substantially the same depth. For the purposes of this description, the floating well region 104, the JTE region 106 and the termination ring region 108 may have a first impurity concentration and a first depth.

Figure 5:
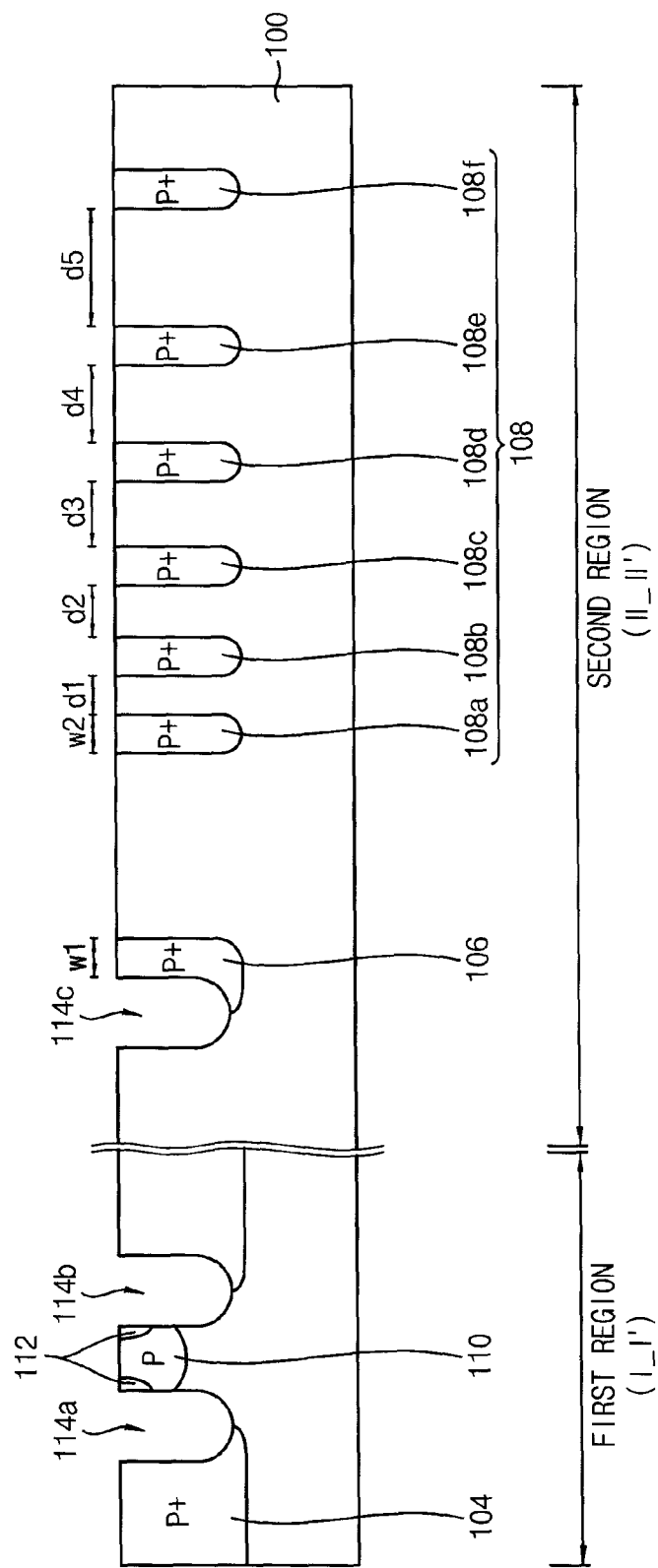

The JTE region 106 may be formed to have a first width W1 at a top surface of the substrate 100, as shown in FIG. 5 and described further below about 0.5 times to about 2 times of a second width W2 of the termination ring region 108. Distances between the termination ring regions 108 may be formed to have the values illustrated with reference to FIG. 1. That is, the distances between the termination ring regions 108 may increase as the distances of the termination ring regions 108 from the first region increase. Thus, widths of the exposed portions and distances between the exposed portions of the first ion implantation mask 102 may be controlled in consideration of the second width W2 of the termination ring regions 108 and the distances between the termination ring regions 108, respectively.

As the described above, in one embodiment, the floating well region 104, the JTE region 106 and the termination ring region 108 may be formed by only one doping process. Thus, a process for the forming of the floating well region 104, the JTE region 106 and the termination ring region 108 may be simplified. After the doping process, the first ion implantation mask 102 may be removed.

Referring to FIG. 5, the second impurity region 110 may be formed by doping p-type impurities onto a first portion of the substrate 100. The second impurity region 110 may be formed to have a depth shallower than that of a gate trench subsequently formed. In the doping process for forming the second impurity region 110, a second ion implantation mask (not shown) may be used.

A first impurity region 112 may be formed by highly doping n-type impurities into the first portion of the substrate 100. The first impurity region 112 may be formed within the second impurity region 110. The first impurity region 112 may have a depth shallower than that of the second impurity region 110. The first impurity region 112 may be formed adjacent to upper sidewalls of the gate trench. In the doping process for forming the first impurity region 112, a third ion implantation mask (not shown) may be used.

Upper portions of the substrate 100 in the first and second regions may be etched to form a first trench 114a, a second trench 114b and a third trench 114c. The first and second trenches 114a and 114b may extend in a first direction. The third trench 114c may be formed between the first and second trenches 114a and 114b in the second region so that the first to third trenches 114a, 114b and 114c may be in fluid communication with each other. In a plan view, the third trench 114c may have a rounded shape.

The first and second trenches 114a and 114b may be spaced apart from each other by a first gap. In a plan view, the first to third trenches 114a, 114b and 114c may form part of a ring shape, and may define a trench structure. In example embodiments, a plurality of trench structures may be formed to be spaced apart from each other by a second gap. The second gap may have a length greater than the first gap.

The first and second impurity regions 112 and 110 may be located between the first and second trenches 114a and 114b, and the floating well region 104 may be located between the plurality of trench structures.

In one embodiment, the first width W1 of the JTE region 106 adjacent to the third trench 114c (e.g., between one sidewall of the JTE region and one sidewall of the trench) may be in a range of about 10 µm to about 20 µm. The first width W1 may be about 0.5 times to about 2 times of the second width W2 of the individual termination ring regions 108.

Figure 6:
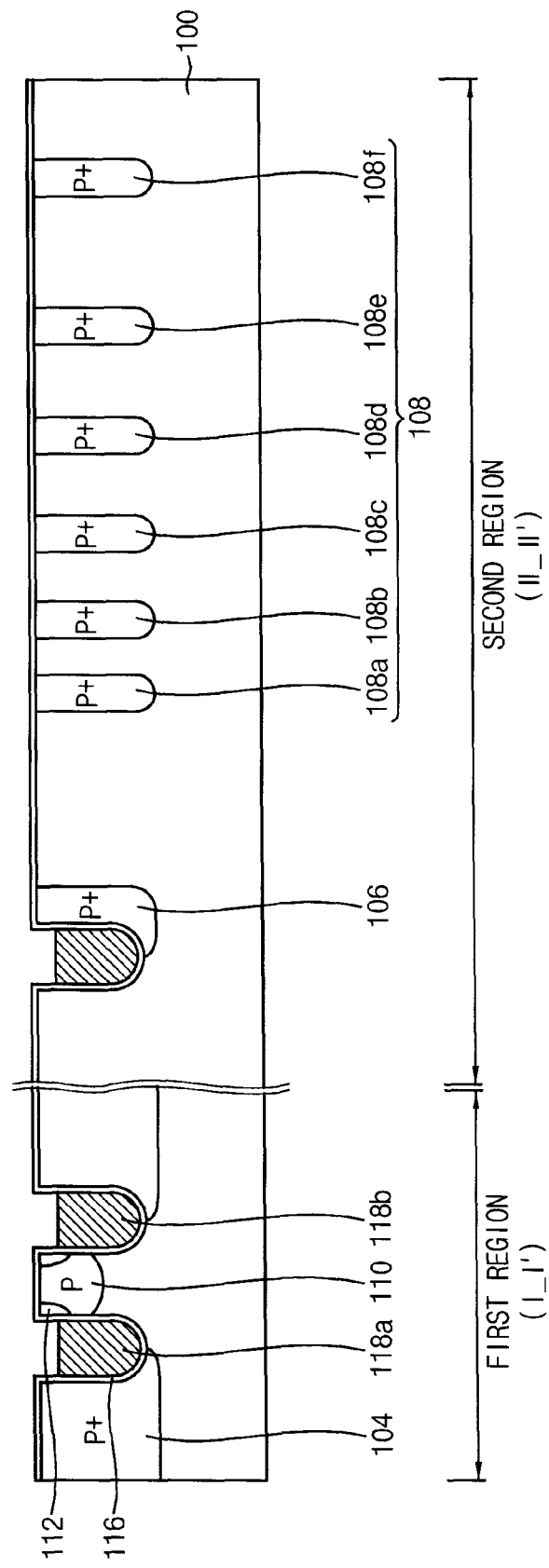

Referring to FIG. 6, a gate insulating layer 116 may be formed on inner surfaces of the first to third trenches 114a, 114b and 114c and the first surface of the substrate 100. A gate electrode layer (not shown) may be formed on the gate insulating layer 116 to fill the first to third trenches 114a, 114b and 114c. The gate electrode layer may be formed to include, e.g., polysilicon and/or a metal.

An upper portion of the gate electrode layer may be planarized by a chemical mechanical polishing (CMP) process and/or an etch back process to form a preliminary gate electrode (not shown) in the first to third trenches 114a, 114b and 114c.

Upper portions of the preliminary gate electrode may be etched to form a gate electrode structure including a first gate electrode 118a, a second gate electrode 118b and a connecting portion 118c in the first to third trenches 114a, 114b and 114c, respectively. In a plan view, the gate electrode structure may have a ring shape.

Figure 7:
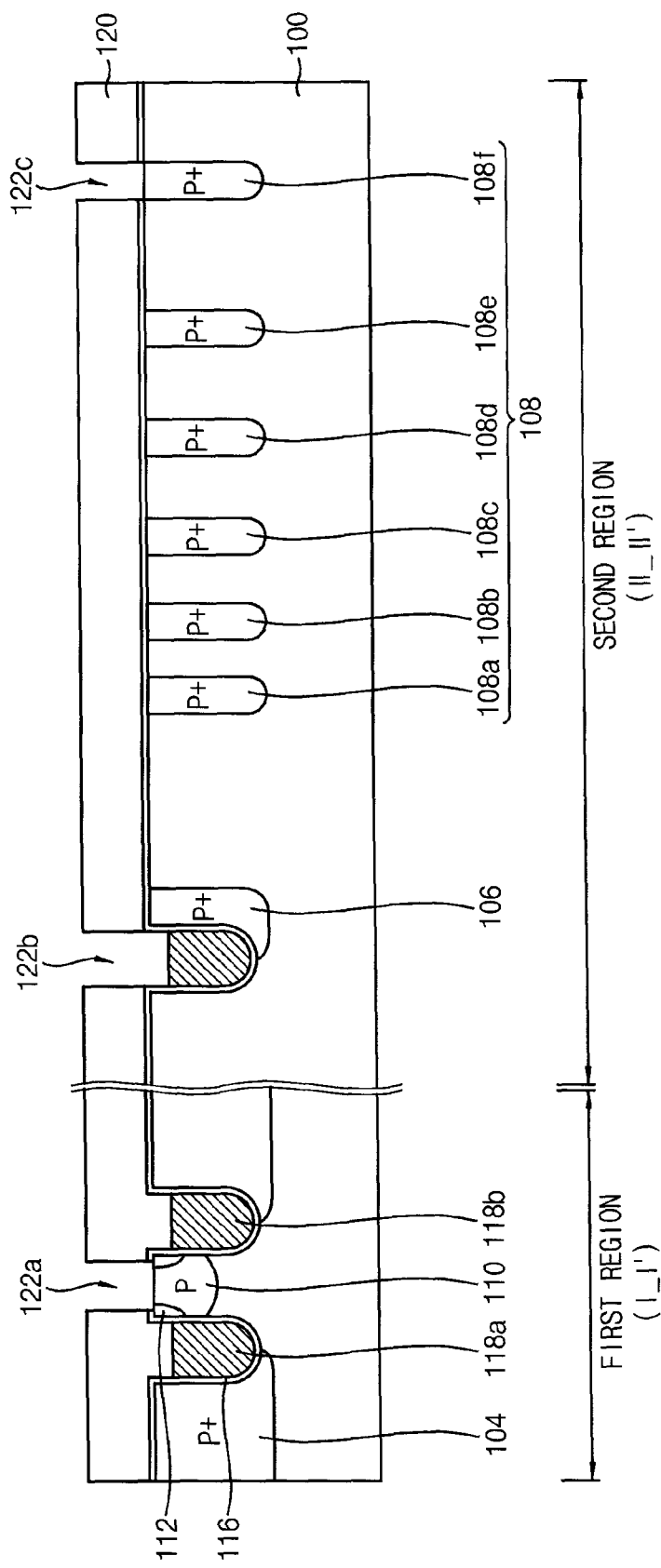

Referring to FIG. 7, an insulating interlayer 120 may be formed on the gate electrode structure and the substrate 100. The insulating interlayer 120 may be formed to include, e.g., silicon oxide. The insulating interlayer 120 may be formed, for example, by a CVD process.

A first contact hole 122a may be formed by partially etching the insulating interlayer 120 to expose the first portion in the first region of the substrate 100. In the etching process, a second contact hole 122b may be formed to expose a top surface of the connecting portion 118c in the second region. Also, in the etching process, at least one third contact hole 122c may be formed to expose a top surface of at least one of the termination ring regions 108.

Figure 8:
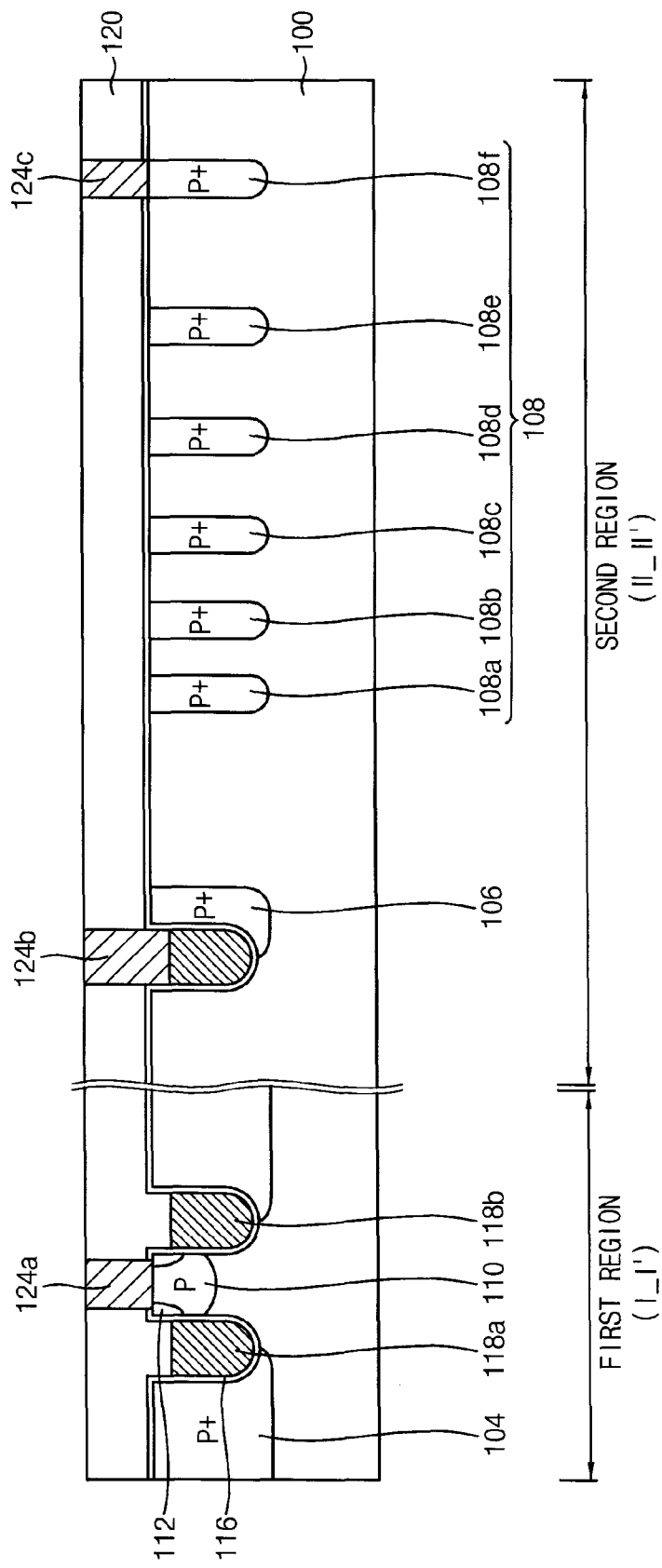

Referring to FIG. 8, a conductive layer such as a metal layer (not shown) may be formed on the insulating interlayer 120 to sufficiently fill the first to third contact holes 122a, 122b and 122c. In example embodiments, the metal layer may be formed to include a metal having a suitable strength to endure a CMP process. In an example embodiment, a barrier metal layer (not shown) may be further formed before forming the metal layer including, e.g., tungsten.

An upper portion of the metal layer may be planarized by a CMP process and/or an etch back process to form a first contact plug 124a, a second contact plug 124b and a third contact plug 124c having flat top surfaces in the first, second and third contact holes 122a, 122b and 122c, respectively. In the planarization process, a top surface of the insulating interlayer 120 may be also planarized so as to be flat.

Figure 9:
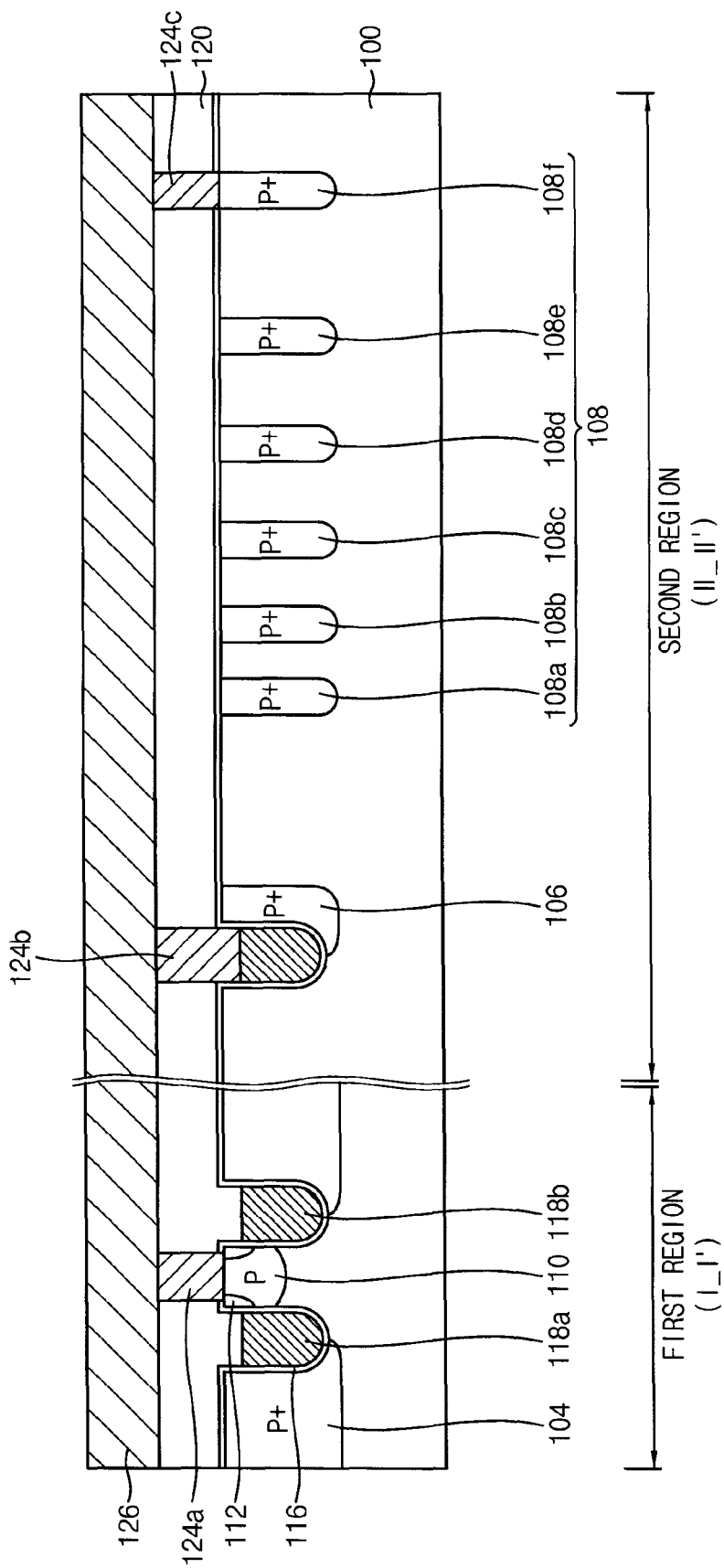

Referring to FIG. 9, a first metal layer 126 may be formed on the insulating interlayer 120 and the first to third contact plugs 124a, 124b and 124c. The insulating interlayer 120 and the first to third contact plugs 124a, 124b and 124c may have the flat top surfaces, the first metal layer 126 may also have a flat top surface. The first metal layer 126 may be formed to include a metal different from that of the first, second and third contact plugs 124a, 124b and 124c. For example, in one embodiment, the first metal layer 126 may include a metal having a resistance lower than that of the first, second and third contact plugs 124a, 124b and 124c. For example, in one embodiment, if the first, second and third contact plugs 124a, 124b and 124c include tungsten, the first metal layer 126 may include aluminum or an aluminum alloy.

Figure 10:
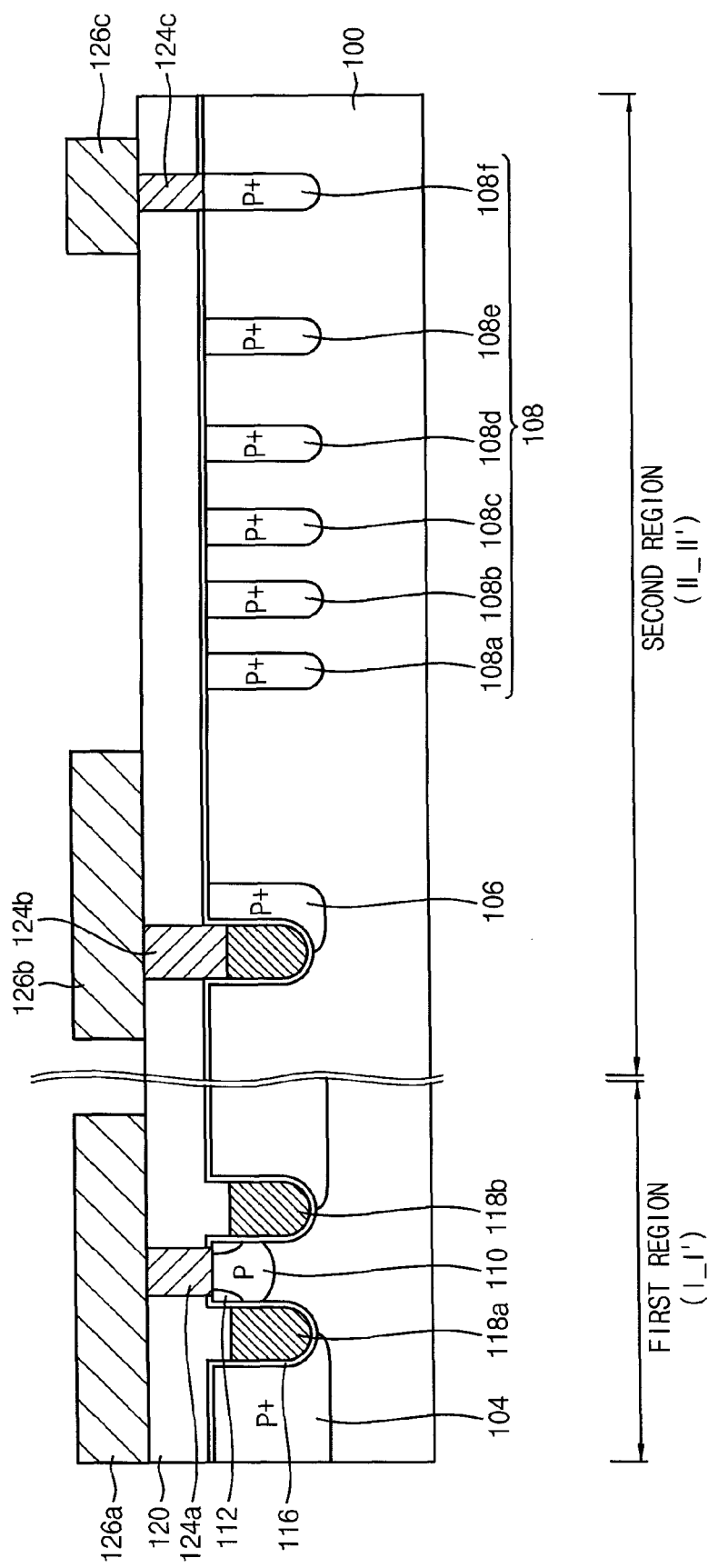

Referring to FIG. 10, a first metal layer pattern 126a, a second metal layer pattern 126b and a third metal layer pattern 126c may be formed by patterning the first metal layer 126.

The first metal layer pattern 126a may be formed on the insulating interlayer 120 in the first region. The first metal layer pattern 126a may serve as an emitter electrode.

The second metal layer pattern 126b may be formed on the insulating interlayer 120 in the second region to contact the second contact plug 124b. The second metal layer pattern 126b may serve as a gate field plate pattern. For example, the second metal layer pattern 126b may be electrically connected to the gate electrode structures in the first region. The second metal layer pattern 126b may have a ring shape surrounding the first region.

The second metal layer pattern 126b may extend in the horizontal direction to be adjacent to the first termination ring region 108a. In another example embodiment, the second metal layer pattern 126b may extend in the horizontal direction to overlap at least one of the termination ring regions 108. For example, a width the second metal layer pattern 126b may be about 30 μm to about 60 μm.

The third metal layer pattern 126c may be formed on the insulating interlayer 120 in the second region to contact the third contact plug 126c. In a plan view, the third metal layer pattern 126c may have a ring shape. In an example embodiment, a plurality of third metal layer patterns 126c may be formed to have a concentric circular ring shape and connect to the plurality of termination ring regions 108 (e.g., through one or more contact plugs 124c). Each metal layer pattern paired with a contact plug may be referred to herein as a conductive terminal.

Due to the second and third metal layer pattern 126b and 126c, the concentration of the electric field on the edge portion of the first region may be decreased.

Figure 11:
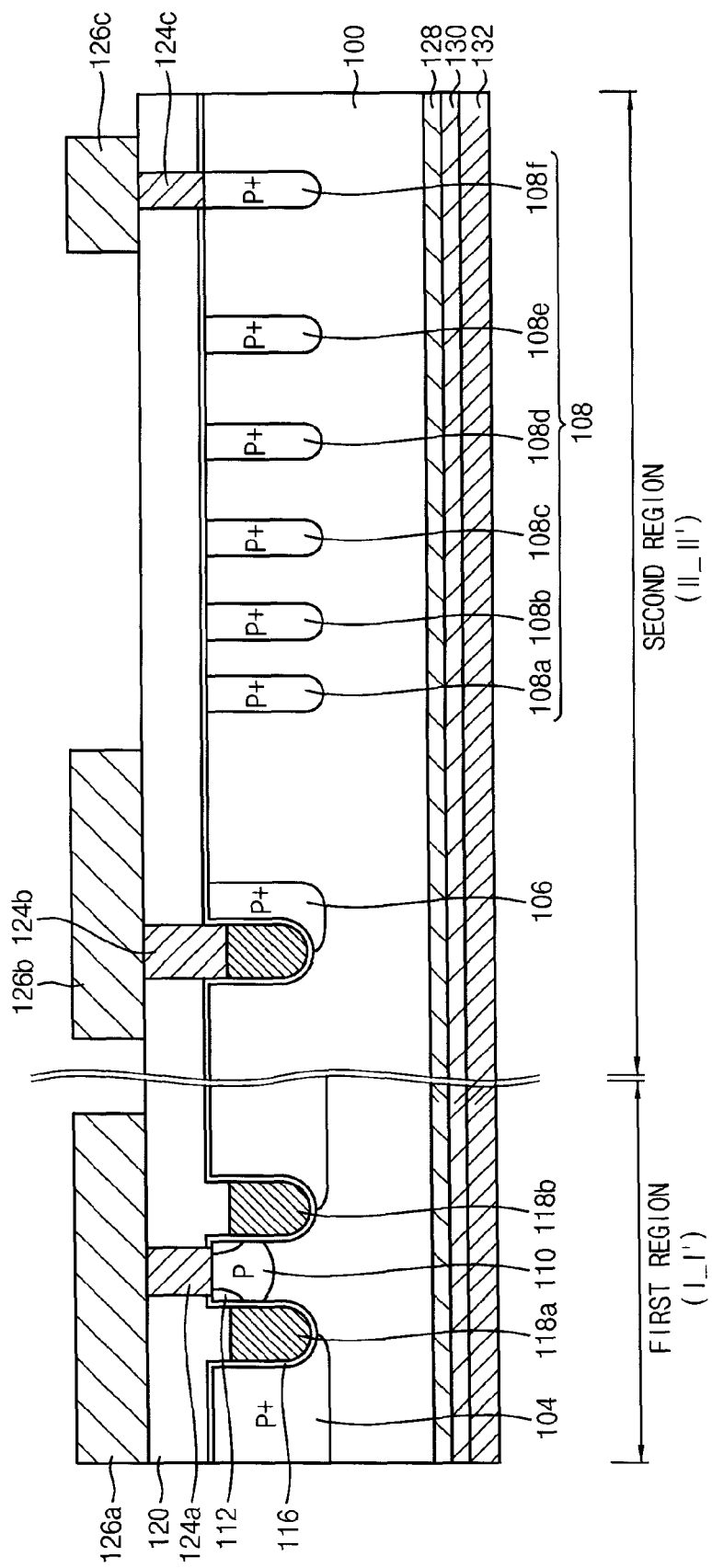

Referring to FIG. 11, a support substrate (not shown) may be formed on the first surface of the substrate 100, and the second surface of the substrate 100 may be polished so that a thickness of the substrate 100 may be reduced.

N-type impurities may be implanted onto the second surface of the substrate 100 to form a field stop region 128. A concentration of the n-type impurities implanted in the field stop region 128 may be higher than a concentration of the n-type impurities previously doped in the substrate 100.

P-type impurities may be implanted onto the second surface of the substrate 100 to form a collector region 130 beneath the field stop region 128, and thus the collector region 130 and the field stop region 128 may be sequentially disposed from the second surface of the substrate 100.

A second metal layer 132 may be formed on the second surface of the substrate 100. The second metal layer 132 may be disposed on the collector region 130. The second metal layer 132 may serve as a collector electrode.

The support substrate is then removed to form the semiconductor power device of FIG. 1.

As illustrated above, the semiconductor power device may be manufactured by simple processes, and may have a high breakdown voltage.

Figure 12:
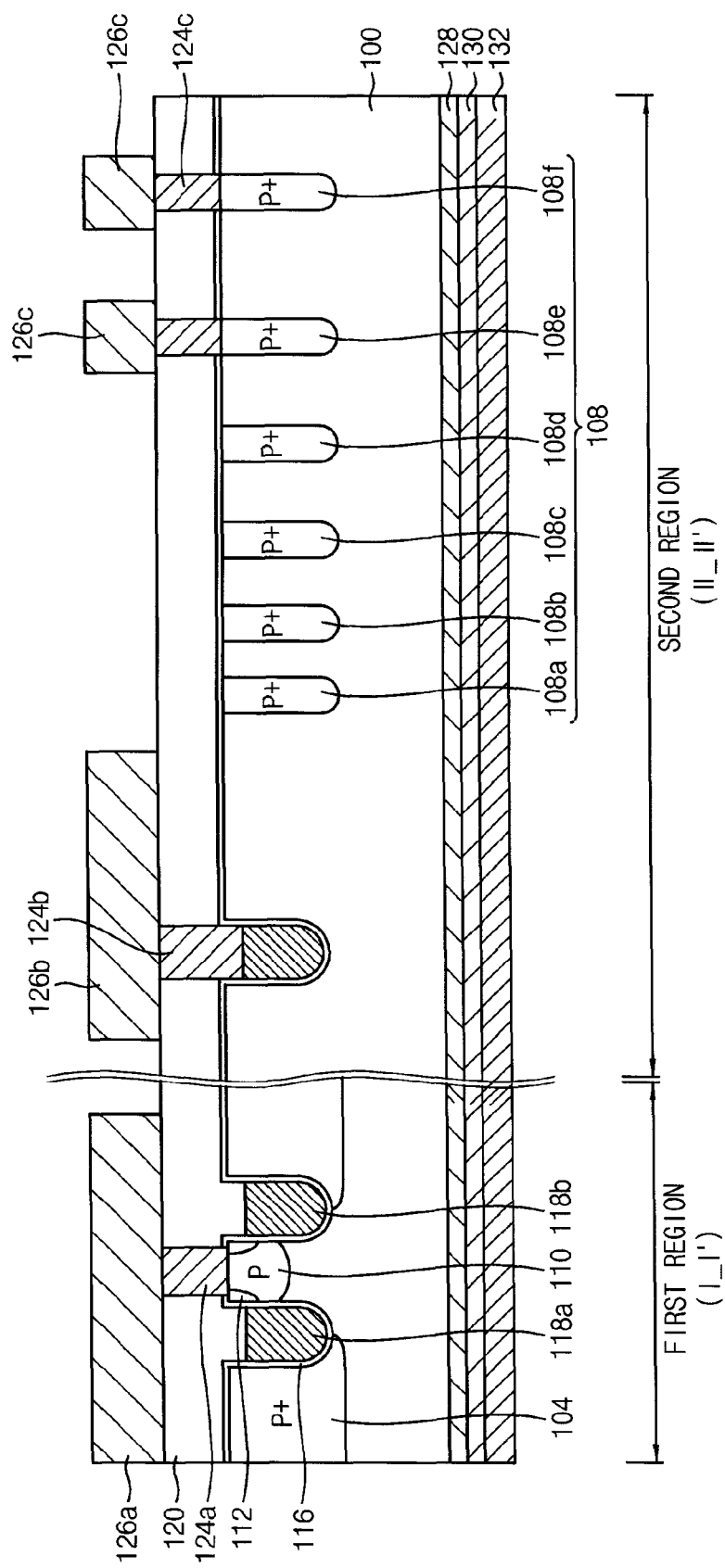

FIG. 12 is a cross-sectional view illustrating a semiconductor power device in accordance with other example embodiments.

A semiconductor power device of FIG. 12 may include substantially the same elements as those of FIGS. 1 to 3 except for the JTE region.

Referring to FIG. 12, a floating well region 104 in the first region and a termination ring region 108 in the second region may have the first impurity concentration and the first depth. However, no JTE region may be formed in the second region. Also, more than one third contact plug 124c may be formed.

At least one third contact plug 124c may be provided to contact at least one of the termination ring regions 108. In example embodiments, a plurality of third contact plugs 124c may be provided to contact the termination ring regions 108, respectively. The plurality of the third metal layer patterns 126c may have a concentric circular ring shape. Due to the second and third metal layer patterns 126b and 126c, the concentration of the electric field may be decreased.

Thus, the semiconductor power device may have a high breakdown voltage even with no JTE region therein.

Figure 13:
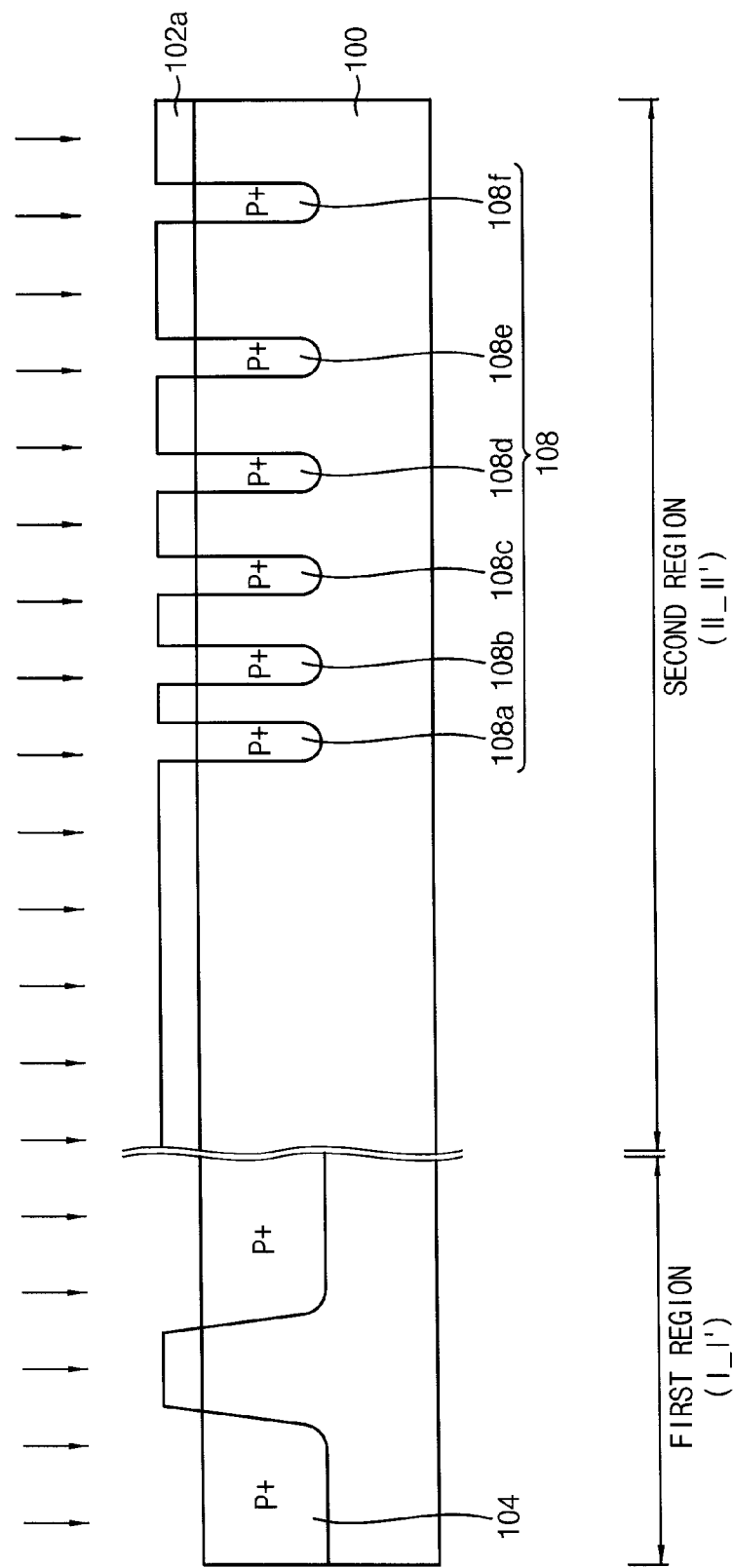

FIG. 13 is a cross-sectional view illustrating a method of manufacturing the semiconductor device of FIG. 12 in accordance with example embodiments.

Referring to FIG. 13, a substrate 100 having a first surface and a second surface opposite to the first surface may be provided. A first ion implantation mask 102a may be formed on the first surface of the substrate 100. The first ion implantation mask 102a may expose portions of the substrate 100 corresponding to a floating well region 104 and a termination ring region 108 subsequently formed.

P-type impurities may be doped onto the substrate 100 using the first ion implantation mask 102a to have a first impurity concentration and a first depth. By the doping process, the floating well region 104 may be formed in the first region, and the termination ring regions 108 may be formed in the second region. As the floating well region 104 and the termination ring region 108 may be formed by the same doping process, the floating well region 104 and the termination ring region 108 may have substantially the same impurity concentration and substantially the same depth. Stated differently, the floating well region 104 and the termination ring region 108 may have the first impurity concentration and the first depth. The floating well region 104 and the termination ring region 108 may have depths deeper than that of a gate trench for forming a gate electrode structure. Distances between the termination ring regions 108 may be formed to have values substantially the same as those illustrated with reference to FIG. 1.

Thereafter, processes substantially the same as or similar to those illustrated with reference to FIGS. 5 to 11 may be performed to manufacture the semiconductor power device of FIG. 13.

Figure 14:
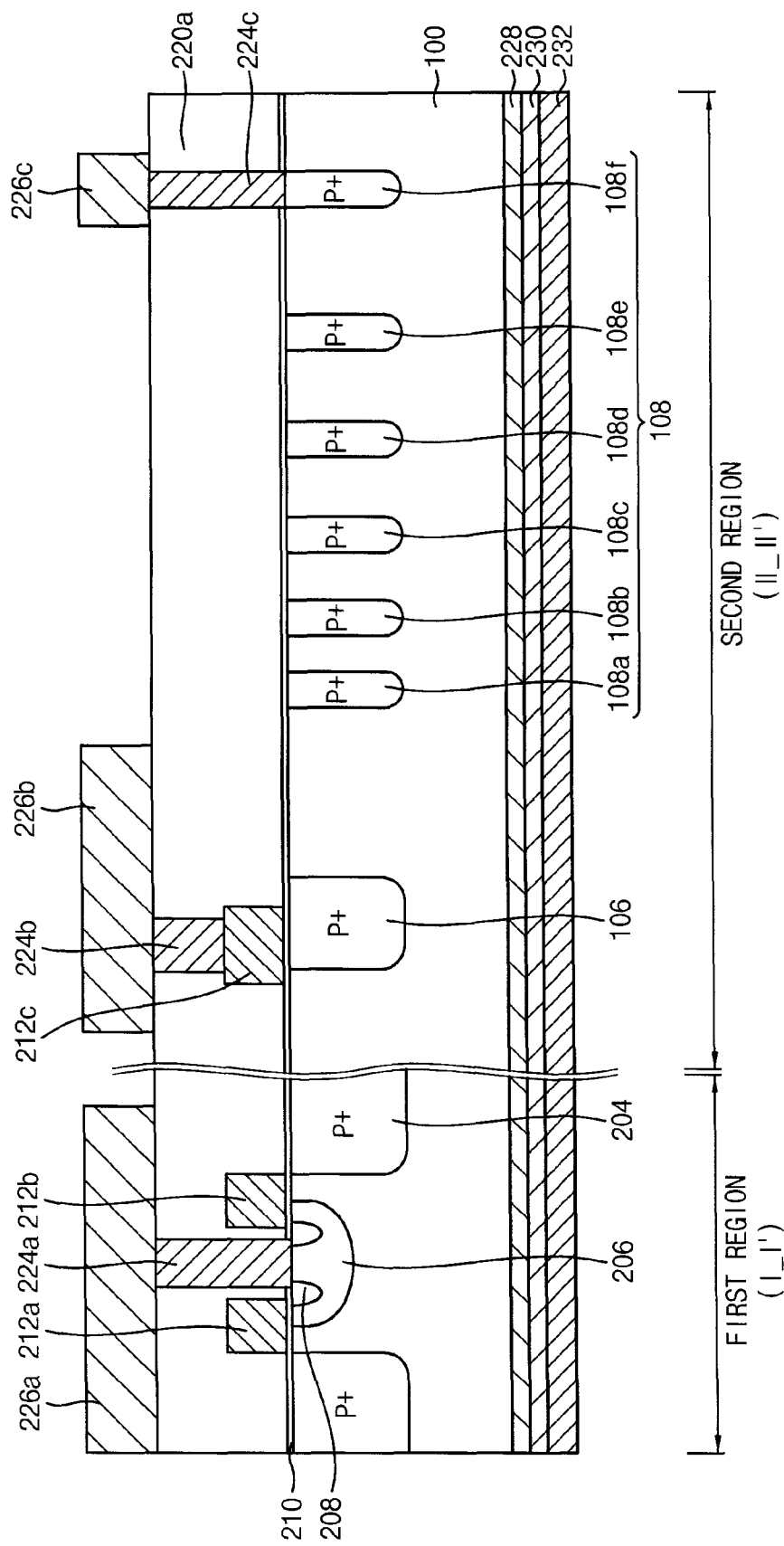

FIG. 14 is a cross-sectional view illustrating a semiconductor power device in accordance with other example embodiments.

The semiconductor power device of FIG. 14 may include a planar type transistor both in a first region and a second region of a substrate 100.

Referring to FIG. 14, the substrate 100 may include the first region and second region surrounding the first region. The substrate 100 may include a first surface, which may be an upper surface for forming a transistor, and a second surface, which may be opposite to the first surface. A gate insulating layer 210 and a gate electrode structure may be provided in the first and second regions of the substrate 100. The gate electrode structure may include a pair of neighboring gate electrodes 212a and 212b and a connecting portion 212c for connecting the neighboring gate electrodes 212a and 212b to each other, and the pair of neighboring gate electrodes 212a and 212b may extend in a first direction. In example embodiments, a plurality of gate electrode structures may be formed in a second direction, and accordingly a plurality of transistors may be formed.

The first and second gate electrodes 212a and 212b may extend from the first region to the second region, and end portions of the first and second gate electrodes 212a and 212b may be connected with each other by the connecting portion 212c in the second region. Thus, in a plan view, the gate electrode structure may have a ring shape.

The gate electrode structure may include, e.g., polysilicon and/or a metal.

A first impurity region 208 and a second impurity region 206 may be provided in a first portion, which may be an upper portion of the substrate 100 between the first and second gate electrodes 212a and 212b. The first portion may be an inner portion of the gate electrode structure having a ring shape. The first impurity region 208 may be provided at upper portions of the substrate 100 adjacent to the first and second gate electrodes 212a and 212b, respectively. The first impurity region 208 may be highly doped with n-type impurities. The second impurity region 206 may be provided at the first portion of the substrate 100 between the first and second gate electrodes 212a and 212b. The second impurity region 206 may be doped with p-type impurities. The first impurity region 208 may be formed within the second impurity region 206.

A switching operation of the transistor may be suppressed in a second portion, which may be may be an upper portion of the substrate 100 between the plurality of gate electrode structures. A floating well region 204 may be provided in the second portion. The floating well region 204 may be doped with impurities having a conductivity type different from that of the impurities of the bare substrate 100. The floating well region 204 may have a concentration of the impurities higher than that of the second impurity region 206. Therefore, the floating well region 204 may be highly doped with p-type impurities.

The floating well region 204 may have a first impurity concentration and a first depth. The first depth may be deeper than a depth of the second impurity region 206.

A JTE region 106 may be provided in the substrate 100 adjacent to the connecting portion 212c between the first and second electrodes 212a and 212b. In example embodiments, a plurality of termination ring regions 108 may be provided in the substrate 100 to be spaced apart from the JTE region 106.

The JTE region 106 may be doped with p-type impurities having the first impurity concentration and the first depth. The termination ring regions 108 may be highly doped with p-type impurities to have the first impurity concentration and the first depth. Thus, the floating well region 108 in the first region, and the JTE region 106 and the termination ring regions 108 in the second region may have substantially the same impurity concentration and substantially the same depth.

The JTE region 106 and the termination ring regions 108 may be substantially the same or similar to those illustrated with reference of to FIGS. 1 to 3. As illustrated with reference to FIGS. 1 to 3, distances between the termination ring regions 108 may increase as the distances of the termination ring regions 108 from the first region increase. As illustrated above, the distances between the termination ring regions 108 may be optimized so that the semiconductor power device may have a high breakdown voltage.

An insulating interlayer 220a may be provided on the first and second regions of the substrate 100 to cover the gate electrode structures. The insulating interlayer 220a may have a flat top surface. The insulating interlayer 220a may include, e.g., silicon oxide. The insulating interlayer 220a may be formed by a CVD process.

A first contact plug 224a may be provided through the insulating interlayer 220a in the first region to contact the first surface in the first portion of the substrate 100. A second contact plug 224b may be provided through the insulating interlayer 220a in the second region to contact the connecting portion 212c between the first and second gate electrodes 212a and 212b. In example embodiments, a plurality of first contact plugs 124a and a plurality of second contact plugs 124b may be formed. Also, at least one third contact plug 224c may be provided through the insulating interlayer 220a in the second region to contact at least one of the termination ring regions 108.

A first metal layer pattern 226a contacting the first contact plugs 224a may be provide to cover most of the first region. The first metal layer pattern 226a may function as an emitter electrode.

A second metal layer pattern 226b may be provided on the insulating interlayer 220a to contact the second contact plugs 224b, and the second metal layer pattern 226b may have a ring shape surrounding the first region. The second metal layer pattern 226b may extend in the horizontal direction to be adjacent to a first termination ring region 108a. For example, a width of the second metal layer pattern 226b may be about 30 μm to about 60 μm.

Third metal layer patterns 226c may be provided on the third contact plug 224c.

The contact plugs 224a, 224b and 224c and the metal layer patterns 226a, 226b and 226c may be substantially the same or similar to those illustrated with reference of to FIGS. 1 to 3.

As the illustrated above, in one embodiment, the floating well regions 104, the JTE region 106 and the termination ring regions 108 may have substantially the same impurity concentration and substantially the same doping depth, and thus the semiconductor power device may be manufactured by simple processes. Also, the distances between the termination ring regions 108 may be optimized, so that the semiconductor device may be highly integrated.

FIGS. 15 to 19 are cross-sectional views illustrating a method of manufacturing the semiconductor device of FIG. 14 in accordance with example embodiments.

Figure 15:
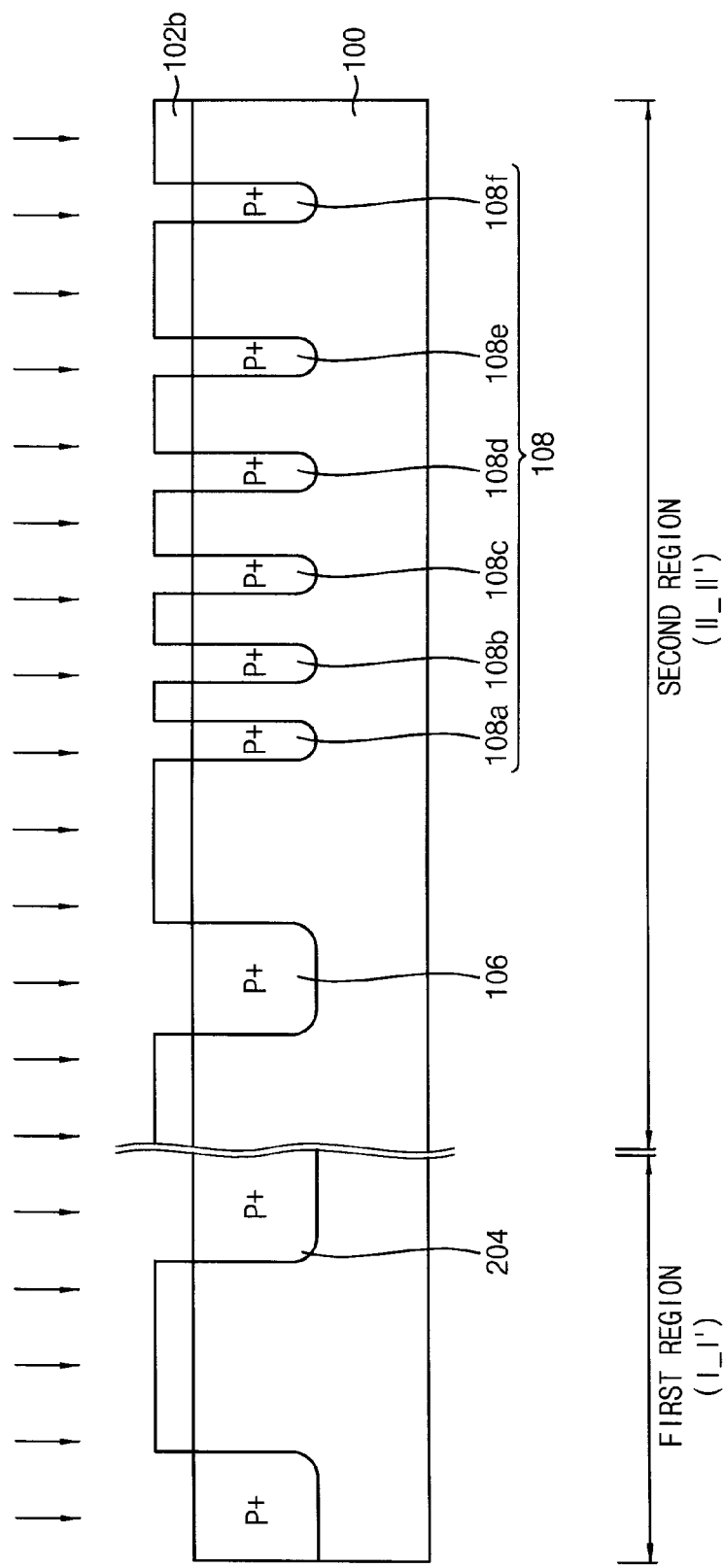

Referring to FIG. 15, a first ion implantation mask 102 is formed on the substrate 100. The first ion implantation mask 102 may be, e.g., a photoresist pattern. The first ion implantation mask 102 exposes portions of the substrate 100 corresponding to a floating well region 204, a JTE region 106 and a termination ring region 108 subsequently formed.

P-type impurities are highly doped onto the substrate 100 using the first ion implantation mask 102. By the doping process, the floating well region 204 is formed in the first region, and the JTE region 106 and the termination ring region 108 is formed in the second region. Because the floating well region 204, the JTE region 106 and the termination ring region 108 may be formed by the same doping process, the floating well region 204, the JTE region 106 and the termination ring region 108 may have substantially the same impurity concentration and substantially the same depth.

The JTE region 106 may be formed to have a particular width, which may be greater than a width of each termination ring sub-region 108. Distances between the termination ring regions 108 may be formed to have values substantially the same as those illustrated with reference to FIG. 1.

Figure 16:
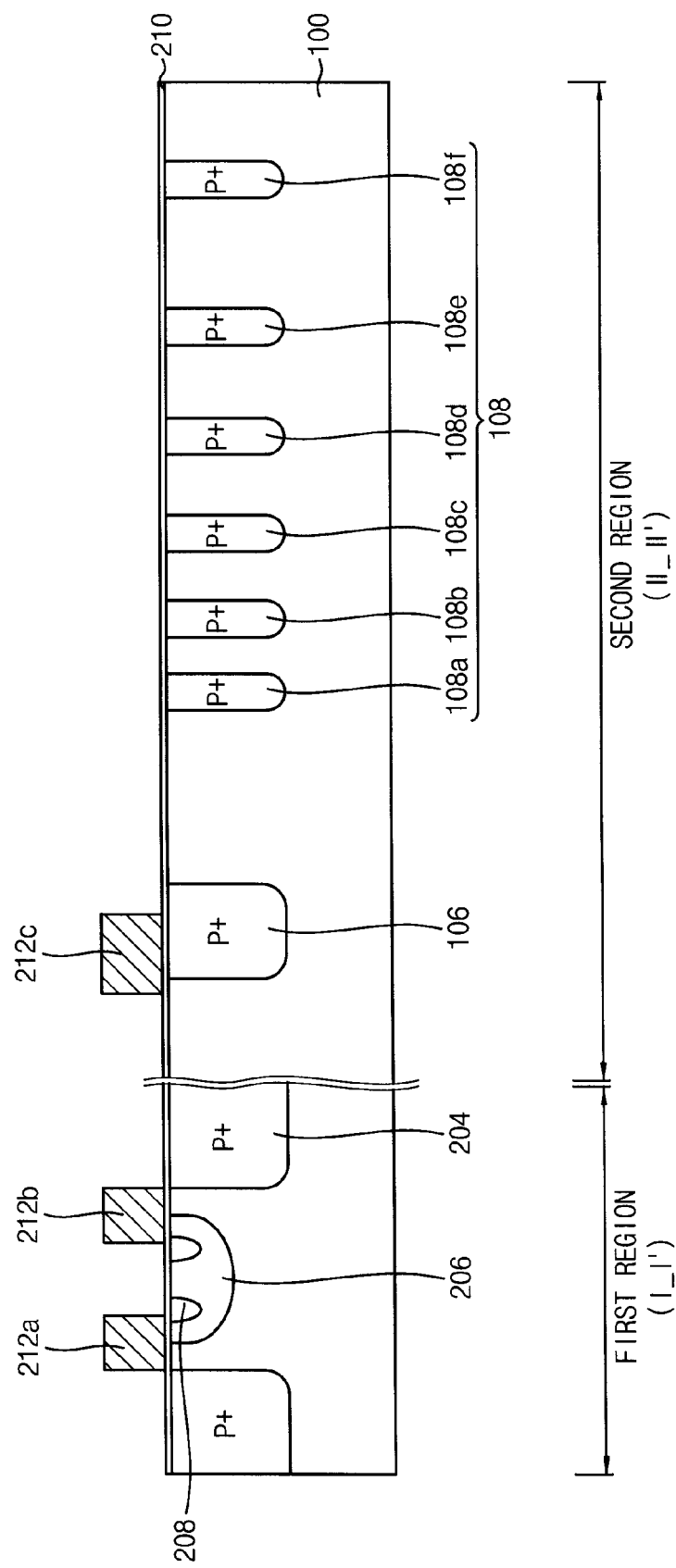

Referring to FIG. 16, a gate insulating layer 210 may be formed on the substrate 100. A gate electrode layer (not shown) may be formed on the gate insulating layer 210, and patterned to form a gate electrode structure. The gate electrode structure may include a first electrode 212a, a second electrode 212b, and a connecting portion 212c. The first and second gate electrodes 212a and 212b may extend from the first region to the second region, and end portions of the first and second gate electrodes 212a and 212b may be connected with each other by the connecting portion 212c in the second region.

A first impurity region 208 and a second impurity region 206 may be formed between the first and second gate electrodes 212a and 212b in the substrate 100.

Figure 17:
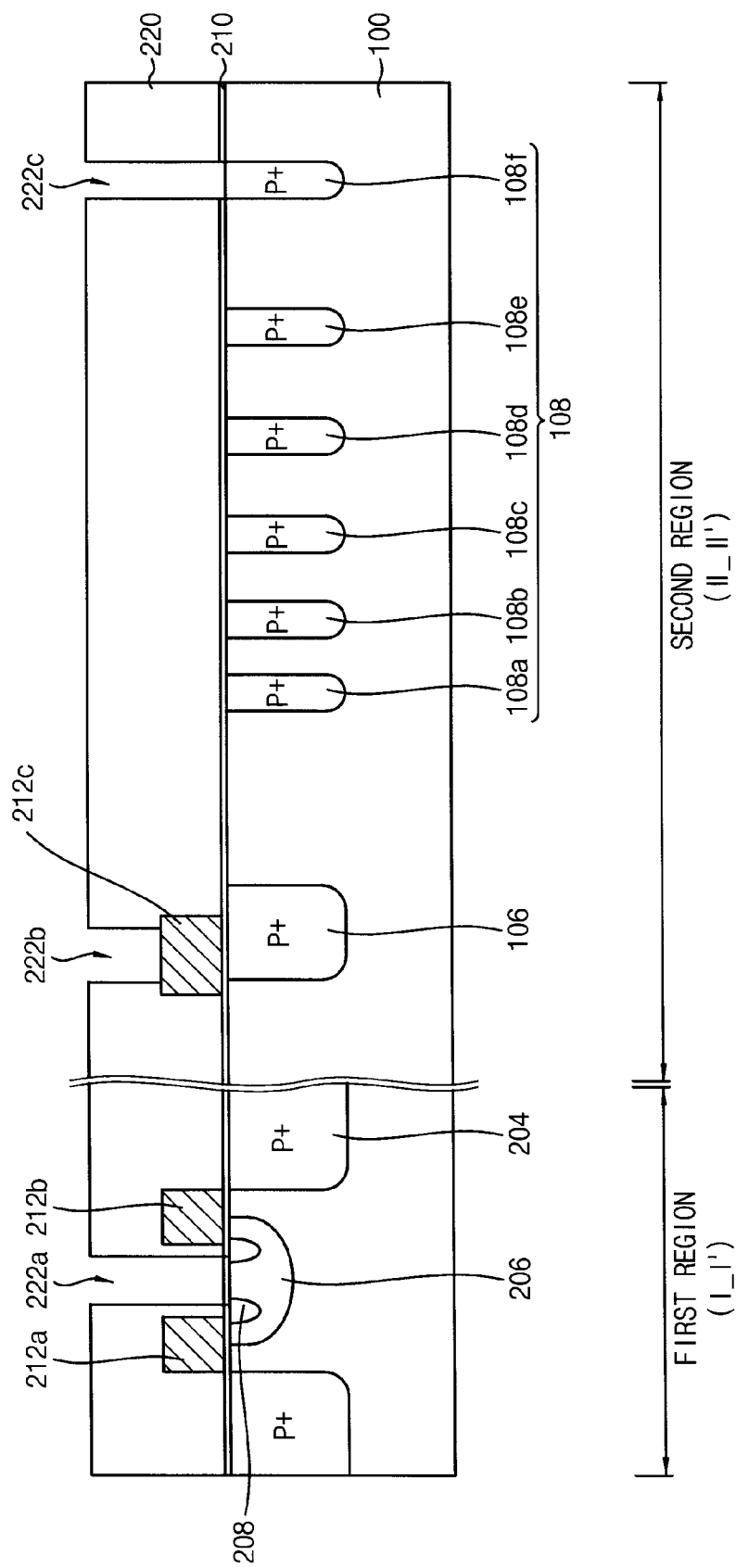

Referring to FIG. 17, a preliminary insulating interlayer 220 may be formed on the substrate 100 to cover the gate electrode structures. The preliminary insulating interlayer 220 may be formed to include, e.g., silicon oxide. The preliminary insulating interlayer 220 may be formed, for example, by a CVD process. A height of the preliminary insulating interlayer 220 may vary according to a position thereof due to the underlying gate electrode structures.

A first contact hole 222a may be formed by partially etching the preliminary insulating interlayer 220 to expose a first portion in the first region of the substrate. In the etching process, a second contact hole 222b may be also formed to expose an upper portion of the connecting portion 212c in the second region. In the etching process, third contact holes 222c may be also formed to expose an upper portion of at least one of the termination ring regions 108.

Figure 18:
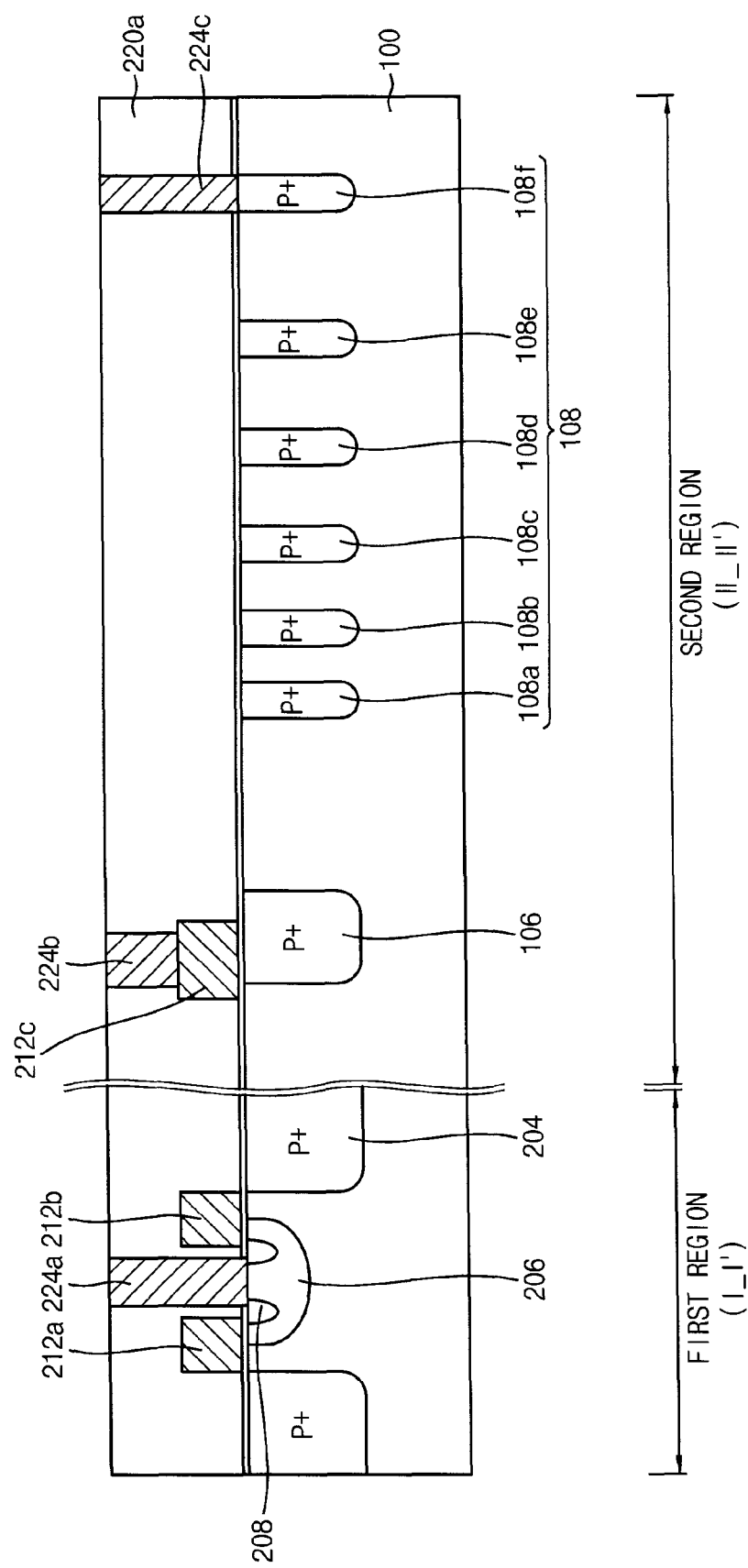

Referring to FIG. 18, a metal layer (not shown) may be formed on the preliminary insulating interlayer 220 to fill the first to third contact holes 222a, 222b and 222c. Thereafter, an upper portion of the metal layer may be planarized by a CMP process and/or an etch back process to form a first contact plug 226a, a second contact plug 226b and a third contact plug 226c in the first, second and third contact holes 222a, 222b and 222c, respectively. In the planarization process, an upper portion of the preliminary insulating interlayer 220 may be also planarized so that an insulating interlayer 220a having a flat top surface may be formed.

Figure 19:
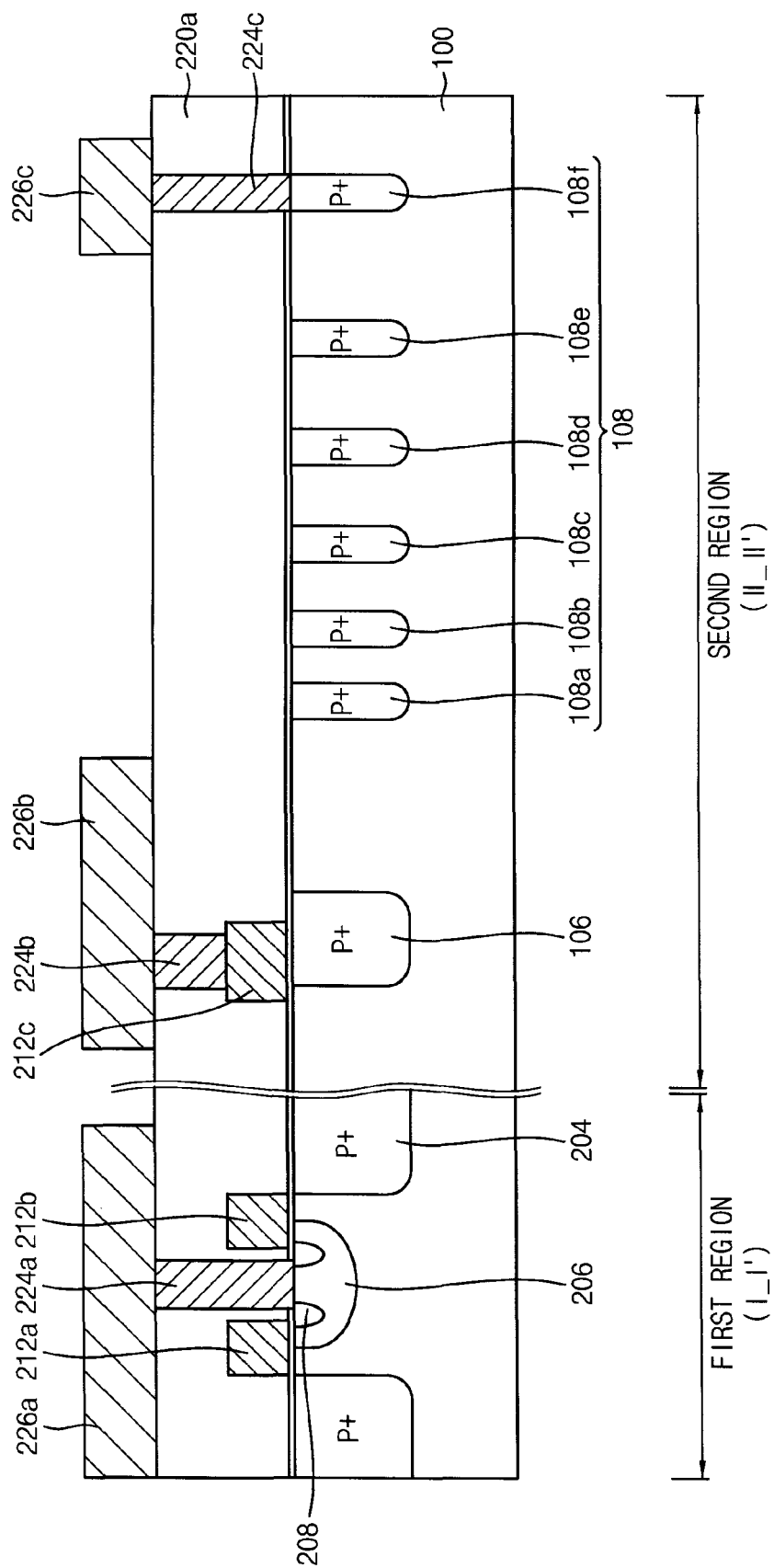

Referring to FIG. 19, a first metal layer (not shown) may be formed on the insulating interlayer 220a and the first to third contact plugs 224a, 224b and 224c, and a first metal layer pattern 226a, a second metal layer pattern 226b and a third metal layer pattern 226c may be formed by patterning the first metal layer by processes substantially the same as or similar to those illustrated with reference to FIGS. 9 and 10.

Thereafter, processes substantially the same as or similar to those illustrated with reference to FIG. 11 may be performed. Thus, as illustrated with reference of to FIG. 14, a field stop region 228, a collector region 230 and a second metal layer 232 may be formed on the second surface of the substrate 100.

The semiconductor power devices described herein may be part of an electronic device, such as a semiconductor chip, a stack of such chips, a semiconductor package including a package substrate and one or more semiconductor chips, or a package-on-package device, for example.

The semiconductor power device may be manufactured by simple processes. Also, the semiconductor power device may have a high breakdown voltage.

EXPERIMENT

Examples 1 and 2

Examples 1 and 2 are semiconductor power devices in accordance with example embodiments. The width of the second metal layer pattern and the distances between the termination ring regions of Examples 1 and 2 are shown in Table 1. In Examples 1 and 2, the second metal layer pattern did not overlap but was adjacent to the first termination ring region. The breakdown voltage of Example 1 was about 1500V, and the breakdown voltage of Example 2 was about 1550V.

Comparative Example

The Comparative Example is a semiconductor power device substantially the same as that of Examples 1 and 2 except for the width of second metal layer pattern and the distances between the termination ring regions. The width of second metal layer pattern and the distances between the termination ring regions of the Comparative Example are shown in Table 1. In the Comparative Example, the second metal layer pattern did not overlap but was adjacent to the first termination ring region. The breakdown voltage of Comparative Example was about 975V.

TABLE 1

|   | width of second metal layer pattern (μm) | first distance (μm) | second distance (μm) | third distance (μm) | fourth distance (μm) | fifth distance (μm) | BV (V) |
| --- | --- | --- | --- | --- | --- | --- | --- |
| Example 1 | 50 | 19 | 21 | 23 | 25 | 30 | 1550 |
| Example 2 | 50 | 16 | 18 | 20 | 22 | 27 | 1500 |
| Comparative Example | 20 | 20 | 20 | 20 | 20 | 20 | 975 |

As can be seen from these experimental results, the width of second metal layer pattern and the distance between the termination ring regions may be optimized, so that the semiconductor device may have a high breakdown voltage, e.g., about 1500 V.

As described above, example embodiments of the semiconductor power device may have good electrical characteristics. The semiconductor power device may be applied to various high power electronic systems.

What is claimed is:

1. A semiconductor power device, comprising:
a substrate having a first region and a second region;
a plurality of gate electrode structures on the substrate, each of the gate electrode structures extending from the first region to the second region and including a first gate electrode, a second gate electrode and a connecting portion, the first and second gate electrodes extending in a first direction, and the connecting portion connecting end portions of the first and second gate electrodes to each other;
a floating well region doped with impurities in the first region of the substrate, the floating well region having a first impurity concentration and a first depth, and a portion of the floating well region being disposed between the gate electrode structures; and
a termination ring region doped with impurities in the second region of the substrate, the termination ring region being spaced apart from the gate electrode structures and having a ring shape surrounding the first region, and the termination ring region having the first impurity concentration and the first depth.

2. The semiconductor power device of claim 1, wherein the termination ring region includes (m+1) termination ring sub-regions (m is a natural number), the termination ring sub-regions being disposed to have a concentric circular ring shape,
and wherein an n-th distance between an n-th termination ring region and an (n+1)-th termination ring region (n is a natural number less than m+1) increases according to the increase of a value of n.

3. The semiconductor power device of claim 2, wherein the n-th distance is in a range of about (2n+12) μm to about (2n+18) μm (n is less than m).

4. The semiconductor power device of claim 2, wherein the n-th distance is in a range of about (2n+15) μm to about (2n+25) μm (n is m).

5. The semiconductor power device of claim 1, wherein the termination ring region includes a plurality of concentric ring sub-regions, wherein as a distance from the first region of the substrate increases, a distance between adjacent ones of the concentric ring sub-regions increases.

6. The semiconductor power device of claim 1, further comprising a junction termination extension (JTE) region in the second region of the substrate, the JTE region having a ring shape surrounding the first region and contacting the connecting portion of each of the gate electrode structures, and the JTE region being doped with impurities having the first impurity concentration and the first depth.

7. The semiconductor power device of claim 6, wherein the termination ring region includes a plurality of termination ring sub-regions including at least a first termination ring sub-region having sidewalls spaced a particular width apart, and a width between one sidewall of the JTE region and an adjacent sidewall of the connecting portion is about 0.5 times to about 2 times of the width between the sidewalls of the first termination ring sub-region.

8. The semiconductor power device of claim 1, further comprising:
   an insulating interlayer having a flat top surface on the substrate and the gate electrode structures;
   a contact plug through the insulating interlayer, the contact plug contacting the connecting portion; and
   a metal layer pattern on the contact plug and the insulating interlayer, the metal layer pattern surrounding the first region and being electrically connected to the gate electrode structures.

9. The semiconductor power device of claim 8, wherein the metal layer pattern is adjacent to the termination ring region, and a width of the metal layer pattern is about 30 μm to about 60 μm.

10. The semiconductor power device of claim 1, wherein the gate electrode structures are buried in the substrate.

11. A semiconductor device, comprising:
   a substrate having a first, inner, region and a second, outer, region horizontally adjacent the first region;
   a plurality of gate electrode structures on the substrate, each of the gate electrode structures extending from the first region to the second region and including a first gate electrode, a second gate electrode and a connecting portion, the first and second gate electrodes extending in a first direction, and the connecting portion connecting end portions of the first and second gate electrodes to each other, wherein each of the first electrode, the second electrode, and the connecting portion are at the same vertical level;
   a floating well region doped with first impurities of a first type and having a first impurity concentration and a first depth in the first region of the substrate, a portion of the floating well region being disposed between the gate electrode structures; and
   a termination ring region doped with the first impurities of the first type in the second region of the substrate, the termination ring region being spaced apart from the gate electrode structures, having a ring shape surrounding the first region, and having the first impurity concentration and the first depth,
   wherein the termination ring region includes a plurality of concentric termination ring sub-regions, at least one termination ring sub-region spaced closer to an inner adjacent termination ring sub-region than to an outer adjacent termination ring sub-region.

12. The semiconductor device of claim 11, wherein the substrate is doped with impurities of a second type opposite the first type.

13. The semiconductor device of claim 11, wherein each termination ring sub-region is formed from a top surface of the substrate into the substrate to the first depth, and further comprising:
   a first metal layer pattern formed above each first gate electrode and each second gate electrode;
   a second metal layer pattern formed above each connecting portion and electrically connected to the corresponding connecting portion; and
   a third metal layer pattern formed above the termination ring region and electrically connected to at least one termination ring sub-region.

14. The semiconductor device of claim 13, further comprising:
   a first contact plug electrically connecting the first metal layer pattern to a first transistor that includes a first gate structure of the plurality of gate structures;
   a second contact plug electrically connecting the second metal layer pattern to one of the connecting portions; and
   a third contact plug electrically connecting the third metal layer pattern to the termination ring region.

15. The semiconductor device of claim 11, further comprising:
   a junction termination region formed outside of the connecting portion and doped with the same impurities and impurity concentration as the termination ring region.

16. The semiconductor device of claim 15, wherein:
   each termination ring sub-region has sidewalls spaced a first distance apart from each other, and
   the connecting portion has a first sidewall and the junction termination region has a second sidewall, the first sidewall spaced a second distance apart from the second sidewall,
   wherein the second distance is about 0.5 to about 2 times the length of the first distance.

17. The semiconductor device of claim 11, wherein the termination ring sub-regions are spaced apart from each other in a gradually increasing manner, and wherein a concentration of an electric field at edge portions of the semiconductor device are decreased based on the distances between the termination ring sub-regions.

* * * * *